(12) United States Patent
Brogan et al.

(10) Patent No.: US 10,320,101 B2
(45) Date of Patent: Jun. 11, 2019

(54) CONNECTOR FOR AN ELECTRONIC DEVICE

(71) Applicant: FAIRPHONE B.V., Amsterdam (NL)

(72) Inventors: Hugh Daniel Brogan, Isle of Man (GB); Olivier Hébert, Amsterdam (NL); George Henry Hines, San Francisco, CA (US)

(73) Assignee: Fairphone B.V., Amsterdam (NL)

( * ) Notice: Subject to any disclaimer, the term of this patent is extended or adjusted under 35 U.S.C. 154(b) by 0 days.

(21) Appl. No.: 15/580,813

(22) PCT Filed: Jun. 9, 2016

(86) PCT No.: PCT/EP2016/063233
§ 371 (c)(1),
(2) Date: Dec. 8, 2017

(87) PCT Pub. No.: WO2016/198559
PCT Pub. Date: Dec. 15, 2016

(65) Prior Publication Data
US 2018/0166809 A1     Jun. 14, 2018

(30) Foreign Application Priority Data

Jun. 10, 2015  (EP) .................................... 15171332
Jun. 11, 2015  (EP) .................................... 15171752

(51) Int. Cl.
*G06F 1/16*     (2006.01)
*H04M 1/02*    (2006.01)
(Continued)

(52) U.S. Cl.
CPC ......... *H01R 12/714* (2013.01); *G06F 1/1637* (2013.01); *G06F 1/1658* (2013.01); *H01R 12/7076* (2013.01); *H01R 13/2407* (2013.01); *H01R 13/5216* (2013.01); *H01R 13/5219* (2013.01); *H01R 13/6594* (2013.01); *H01R 13/6598* (2013.01); *H04M 1/0266* (2013.01); *H05K 7/1069* (2013.01); *H01R 2107/00* (2013.01)

(58) Field of Classification Search
CPC ........ H01R 13/6581–13/6597; H01R 13/2407; H01R 13/5216; H01R 13/5219; H01R 13/6598; H01R 12/714; H01R 12/7076; H01R 2107/00; G06F 1/1637; G06F 1/1658; H04M 1/0266; H05K 7/1069
USPC ............... 439/607.02, 607.03, 607.18, 607.3
See application file for complete search history.

(56) References Cited

U.S. PATENT DOCUMENTS 4,401,355 A * 8/1983 Young ................. H01R 13/7197
439/607.11
4,737,123 A * 4/1988 Paler .................... H01R 13/648
439/607.18

(Continued)

*Primary Examiner* — Gary F Paumen
(74) *Attorney, Agent, or Firm* — Occhiuti & Rohlicek LLP

(57) ABSTRACT

The invention provides a connector (16) for functionally coupling a module (8) in a modular electronic device, in particular a portable device, more in particular a handheld device (1), comprising a first connector end, wherein said first connector end comprises a series of contacts (34) and an electromagnetic shielding (81) surrounding said contacts (34). Said connector (16) is in particular suited for a modular electronic device (1), for electronically coupling its modules (8) to a chassis (9).

12 Claims, 17 Drawing Sheets

(51) Int. Cl.
*H05K 7/10* (2006.01)
*H01R 12/70* (2011.01)
*H01R 12/71* (2011.01)
*H01R 13/24* (2006.01)
*H01R 13/52* (2006.01)
*H01R 107/00* (2006.01)
*H01R 13/6594* (2011.01)
*H01R 13/6598* (2011.01)

(56) References Cited

U.S. PATENT DOCUMENTS

| | | | |
|---|---|---|---|
| 5,017,158 A | 5/1991 | Liu et al. | |
| 6,129,555 A | 10/2000 | Daikuhara et al. | |
| 7,625,223 B1 * | 12/2009 | Fogg | H05K 5/0247 361/715 |
| 8,002,581 B1 * | 8/2011 | Whiteman, Jr. | H01R 12/724 439/607.18 |
| 2012/0184138 A1 * | 7/2012 | Davis | H01R 12/724 439/607.3 |
| 2014/0078708 A1 | 3/2014 | Song et al. | |
| 2014/0206221 A1 | 7/2014 | Morley | |
| 2014/0252779 A1 | 9/2014 | Toivanen | |

\* cited by examiner

CONNECTOR FOR AN ELECTRONIC
DEVICE

CROSS REFERENCE TO RELATED APPLICATIONS

This application is a National Phase under 35 USC 371 of International Application No. PCT/EP2016/063233 filed on Jun. 9, 2016, which claims priority to European Application No. 15171752.7 filed Jun. 11, 2015, and European Application No. 15171332.8 filed Jun. 10, 2015, the contents of which are hereby incorporated by reference in their entirety.

FIELD OF THE INVENTION

The invention relates to a connector for functionally coupling modules in an electronic device, and an electronic device comprising the connector.

BACKGROUND OF THE INVENTION

The current trend in electronic devices, like in particular mobile phones that became "smartphones" and electronic devices like "tablets", is to make these devices as compact as possible. This has led to further integration of components of these electronic devices. Integration of components at first led to less failure. When looking for instance at televisions, this is evident.

Many devices, like the already mentioned mobile phones and tablets, have many parts that remain vulnerable to damage, in particular because of the mobile, hand-held nature of these electronic devices. Displays shatter or break, plugs break, microphones and speakers attract dirt and dust and break down. Further and further integration however make it more and more impossible to repair these electronic devices, despite the increasing costs of these high-tech devices.

Another trend in electronic devices, and in particular in mobile phones, tablets and other hand-held devices, is the improvement of performance.

The applicant is a social enterprise with the goal of creating a fairer economy. Applicant seeks to open up supply chains to understand how things are made and build stronger connections between people and their products. The electronic devices that are developed by the applicant serve to uncover production systems, address challenging problems and stimulate discussions about what is truly fair. Thus, leading by example to expand the market for ethical products and giving a voice to consumers that care about social values. Together with a community formed, applicant wants to change the way products are made. To that end, applicant defined five core action areas:

Mining: Applicant wants to source materials that support local economies, not armed militias.

Design: Focusing on longevity and reparability to extend the phone's usable life and give buyers more control over their products.

Manufacturing: Factory workers deserve safe conditions, fair wages and worker representation. Applicant works closely with manufacturers that want to invest in employee wellbeing.

Life Cycle: Applicant addresses the full lifespan of mobile phones, including use, reuse and safe recycling.

Social Entrepreneurship: Applicant works to create a new economy with a focus on social values. By operating transparently and sharing the story, applicant is helping consumers make informed decisions about what they buy.

US2014206221 according to its abstract describes an electrical connector system that includes a backplane connector and a daughtercard connector coupled to the backplane connector. The backplane connector includes a housing holding a plurality of backplane contact assemblies that are movable relative to the housing and each have a center contact and an outer shell surrounding the center contact configured to be terminated to coaxial cables. The daughtercard connector includes a housing holding a plurality of daughtercard contact assemblies coupled to corresponding backplane contact assemblies. The daughtercard contact assemblies are configured to be directly terminated to a daughtercard circuit board.

US2010067854 according to its abstract describes a mechanism to fix the new type of the pluggable optical transceiver to the host system, where the optical transceiver provides the screws, while, the host system has the face panel with a port and the rail system between which the optical transceiver is set through the port. In the present invention, the screw of the transceiver is fastened to the rail not the face panel, and the rail is precisely aligned with the electrical connector. Thus, the pluggable transceiver in the electrical plug thereof is exactly mated with the electrical connector of the host system.

EP1032090 according to its abstract describes a shielded electrical connector system that includes a conductive chassis having an opening. An electrical connector is insertable into the opening in an insertion direction. The connector includes a dielectric housing mounting a plurality of terminals. A conductive shield is mounted about at least a portion of the housing and includes at least one side wall having a contact beam projecting outwardly therefrom. The contact beam extends back over the side wall to apply a normal force to the chassis adjacent the opening in a direction generally perpendicular to the insertion direction of the connector. In an alternative embodiment, the contact beam is formed to apply a normal force to a surface of the chassis adjacent the opening in a direction generally parallel to the insertion direction of the connector US2012249381 according to its abstract describes a radio frequency (RF) printed circuit board (PCB) includes an RF circuit for generating high frequency signals. The RF PCB is connected to an EMC measuring device when measuring the EMC thereof. The measuring device includes a probe pin and a shielding barrel surrounding the probe pin. The shielding barrel includes an end surface at a distal end thereof. The RF PCB further includes a test node connected to the RF circuit and a ground node surrounding the test node. The test node contacts the probe pin and outputs the high frequency signals when measuring the EMC of the RF PCB. The ground node corresponds to the end surface and contacts the end surface while the probe pin contacts the test node.

Recently, an initiative called "phonebloks" was launched. It presented concept of a modular mobile phone having various blocks that attach to a base. No detailed embodiment was presented, however. It seems to relate to rectangular, functional blocks that are all plugged into a common breadboard.

SUMMARY OF THE INVENTION

It is an aspect of the invention to provide a connector that provides secure functional coupling of modules in a modular electronic device. Furthermore or alternatively, it is an aspect of the invention to provide an electronic device with improved use, reuse and/or safe recycling. Furthermore or alternatively, it is an aspect of the invention to provide an electronic device which can be produced in improved working conditions. Furthermore or alternatively, it is an aspect of the invention to provide an electronic device with extended life cycle due to refurbishment, repair and/or upgrading. Furthermore or alternatively, it is an aspect of the invention to provide an electronic device which requires less natural resources, in particular during its life cycle. To that end, it was found that functional coupling of modules needed improvement.

The invention thus provides a connector, said connector comprising a first connector end which comprises a series of first contacts and a first shielding part, said connector further comprising a second connector end comprising a series of second contacts and a second shielding part, wherein when said first and second connector ends are mutually connected, at least part of said first and second contacts are in electrical contact, and said first and second shielding parts are in electrical contact and provide an electromagnetic shielding surrounding said first and second contacts.

In particular, said connector is for functionally coupling a module into a modular electronic device, in particular a portable device, more in particular a handheld device.

In an embodiment, at least one of said first and second shielding parts comprise a conductive ring. Such a ring may form a conductive wall around the contacts In an embodiment, the conductive ring comprises a shielding gasket around said contacts. In an embodiment, said shielding gasket is an elastically compressible and electrically conductive shielding gasket. In particular, said shielding gasket comprises a conductive elastomer ring. In particular said shielding gasket comprises a ridged insert. In particular a metal insert is provided in said elastomer ring. It was found that such a flexible, elastic gasket provides easy attachable contacts. In modular devices, it allows easy removal and installation of modules.

In an embodiment, the shielding part comprising a conductive slide-protective surface on said shielding gasket.

In an embodiment, the shielding gasket is attached into an opening in a housing holding one of said first or second connector ends providing coupling access to said connector end via said opening. In particular said shielding gasket comprising an elastomeric ring moulded onto said housing. Thus, a shielding part can be provided easily and secure.

In an embodiment, the first contacts comprise biased contact pins. In particular said contacts comprise a spring-biased end movable in an axial direction of said contact pins. More in particular said contacts comprise spring-biased ends axially movable in a cylinder. For instance, pogo pins may be used. Thus, connector ends may be pressed onto one another and the contacts come in secure contact.

In an embodiment, the first connector end comprises a connector body provided with through holes housing said contact pins. For instance, a block of polymer material provided with through holes is provided.

In an embodiment, at least one of said shielding parts further comprise a conductive ring around said connector body. In an embodiment, the conductive ring comprises a metal ring fitting around said connector body.

In an embodiment, at least one of said shielding parts comprise a conductive ring enclosing said connector body, said conductive ring comprising connector lips that extend substantially parallel to said shielding ring and that are flexible in radial direction of said shielding ring. These connector lips can flex toward the conductive ring.

The other shielding past comprises conductive walls extending at opposite sides of the contacts, and having a mutual distance adapted for engaging the connector lips biased towards the connector end.

In particular, the conductive ring has to straight opposite sides, each side provided with at least one connector lip.

The connector lips may be provided with extending cams and the walls may be provided with corresponding recesses. This, the connector lips snap in place on the walls.

The connector allows slide coupling, for instance for attaching a display module to the electronic device.

In an embodiment, at least one of said shielding parts comprises a conductive ring comprising contact lips extending in axial direction of said conductive ring at least up to the ends of the contacts, said contact lips being flexible to allow flexing away from said connector body. In particular said contact lips flex away for contacting the other shielding part, for instance a grounding track on an opposite circuit board. When connector ends are pressed onto one another for coupling, the contact lips come to engage the opposite connector end and start bending outwards. Thus, contact is secure.

In an embodiment, the second contacts are conducting patches, positioned for a patch to correspond to a first contact, and said patches surrounded by a peripheral conductive track surrounding said contact patches for providing at least part of said second shielding part. Thus, a relatively simple connector end is provided. Such a second connector end may for instance be selected for the modules, including the display module.

The invention further relates to a modular electronic device, in particular a portable device, more in particular a handheld device, said modular electronic device comprising the connector of the current invention. Using the connector, removal and installation of modules can be done by any untrained person.

In an embodiment, the modular device comprises a chassis comprising a bus comprising at least two first connector ends, and at least two modules each comprising a second connector end.

In an embodiment, the modular electronic device further comprises:

a chassis comprising a frame holding a computational module comprising a circuit board holding a data processor and said bus, and a display module comprising a planar display device having a viewing side and a rear side, said display module comprising a back plate on the rear side of the display device, wherein said chassis comprises at least one of said first or second connector ends and said modules comprises said other of said first and second connector end.

In an embodiment of the modular electronic device, the back plate of said display module comprises an electrically conductive plate forming an electromagnetic shielding layer for providing a common ground for said modular electronic device, in particular said conductive back plate is from one selected from magnesium and a magnesium alloy, for providing rigidity to said display module, and said conductive back plate is electrically coupled to at least one of said shielding parts.

In an embodiment, the modular electronic device further comprising at least one selected from a camera module comprising a housing and a camera device said chassis comprises an opening having a shape adapted to fit at least part of said housing of said camera module;

a receiver module comprising a speaker and a housing, said chassis comprises an opening having a shape adapted to fit at least part of said housing of said receiver module, and a speaker module comprising a speaker and a housing, said chassis comprises an opening having a shape adapted to fit at least part of said housing of said speaker module, wherein said modules each comprise at least one of said connector ends and said chassis comprises said other connector end.

The invention further relates to a connector for functionally coupling a module in a modular electronic device, in particular a portable device, more in particular a handheld device, said connector comprising a first connector end, wherein said first connector end comprises a series of first contacts and an electromagnetic shielding surrounding said first contacts.

In an embodiment, the connector further comprising a second connector end comprises a series of second contacts at least part of these second contacts positioned to contact at least part of said first contacts, and comprising an electromagnetic shielding surrounding said second contacts.

The invention further relates to a plug for a connector described in this application, forming a first connector end of a connector according to the invention.

The invention further relates to a socket for a connector of this application, forming a second connector end of a connector according to the invention.

The invention further relates to a modular electronic device comprising a chassis, at least two modules comprising functional devices and a substantial planar display module, wherein said modules are attached to front side of said chassis, and said display module is attached to said front said of chassis covering said at least two modules. A back cover may be provided to the apposite side of the chassis. In an embodiment, a battery may be provided on the back side of the chassis. The battery may be snapped in place on the chassis. The back cover may also cover the battery.

The invention further pertains to a modular electronic device, in particular a portable device, more in particular a handheld device, said modular electronic device comprising a chassis comprising a frame holding a computational module comprising a circuit board holding a data processor, and a display module comprising a planar display device having a viewing side and a rear side, said display module comprising a back plate on the rear side of the display device, wherein said frame further comprises a frame attachment part and said back plate comprises a display attachment part for allowing said display module to be attached to said frame in a sliding manner in a sliding direction in-plane of said planar display device, and said frame comprising a frame lock part and said display module comprising a display lock part for in a mutually locked position locking said frame and said display module onto one another, blocking said sliding, and in a mutually released position allowing sliding of said display module and said frame with respect to one another for allowing removal of said display module from said frame.

The applicant came to the conclusion that the replacement cycle of electronic devices put a heavy burden on natural resources. Furthermore, applicant came to the conclusion that failure of some minor parts of electronic devices nowadays leads to a complete replacement of a device, or specialised repair that requires time, and leads to replacement to integrated component, which in turn again leads to a heavy burden on natural resources. This became even more harrowing as many parts require raw materials that are mined in development countries where miners work under poor conditions. Applicant was seeking to solve these problems, while still providing electronic devices that appeal to the public, including techno geeks.

In its analysis, applicant found that not all parts and components have the same failure rate or have the same breakage rate. Furthermore, applicant found that not all components have the same life cycle and/or cycle of technological development. For instance, analysis of the applicant lead to the insight that for instance parts like a display, camera and the like have a high and faster development rate.

The mobile communication protocols and networking technology, however, develop much slower, in particular the general acceptance and introduction are results from standardization processes and develop relatively slowly.

Applicant came to the concept of a modular electronic device, which was 180 degrees different from the ongoing integration of components.

A next step was to identify the different modules that needed to be developed. Careful analysis of failure statistics, repair practises, and the like led to a grouping of components into different modules.

Placing components into modules however led to additional and new problems that were not foreseen earlier. For instance, shielding of a module became necessary. Providing proper contact between modules became a new field of problems that needed to be solved.

A further philosophy of the applicant, which further complicated the design, was that repair and upgrading of an electronic device should be done at a low level, if possible at the user side. This would, according to the philosophy of the applicant, lead to a further involvement of the users with his electronic device, and possible involvement and engagement on the side of the user with issues like production circumstances, preservation of natural resources, and fair trade issues. In fact, when providing an electronic device that was build modularly, having modules that could be upgraded individually, modules that could be replaced and repaired individually, would make it possible for a user or consumer to make choices regarding their electronic device that included fair trade, preservation of natural resources, equal opportunities, socially responsible production, and the like.

In general, a chassis has an internal framework that supports a man-made object in its construction and use. A common example of a chassis is the underpart of a motor vehicle, consisting of the frame (on which the body is mounted). In general, it is a structural part onto which further parts are mounted.

In an electronic device the chassis comprises a frame or other internal supporting structure on which the circuit boards and other electronics are mounted.

In the absence of a frame, the chassis refers to the circuit boards and components themselves, not the physical structure.

In some known designs, such as for instance older television and radio sets, the chassis is mounted inside a heavy, rigid cabinet. In other designs such as modern computer cases, lightweight covers or panels are attached to the chassis.

A combination of chassis and one or more outer covering parts can be referred to as an enclosure or a housing.

In an embodiment of the modular electronic device, the display attachment part comprises a series of hooks having an end part extending in said sliding direction and said frame attachment part comprises corresponding hooks extending in said sliding direction and a stop blocking further sliding when said display module is at a coupled position on said frame.

In an embodiment, the display lock and said frame lock comprise a latch that is displaceable in a direction that is at an angle with respect to said sliding direction for engaging a lock member in said locked position and releasing one another in said released position. In an embodiment thereof, said latch is displaceable in a lock direction that is perpendicular to said sliding direction. In a more particular embodiment, said latch runs on a rail.

Thus, it allows a display module to be attached to a frame by first sliding it and then locking the display module onto the frame. In this way, it is possible to assemble and disassemble without using any additional tools. With a planar display, it can be connected or releasably mounted or fixed to one side of the frame.

In an embodiment, the modular electronic device further comprises a battery, snapped onto said frame, wherein said display module comprises a cam at its rear side engaging said battery for blocking removal of said display module from said frame when said battery is snapped onto said frame. In an embodiment, the display module is attached to one side of the frame, and the battery can be snapped onto the other side of the frame. Thus, the battery can be removed without need to handle the display module. Usually, the display is the largest user of power and/or has the largest capacitance. Thus, it is beneficial if the display module can not be removed from the chassis or from the frame while the battery is in place.

In an embodiment, one of said circuit board and said display module comprises a first connector end and the other comprises a second connector end that is complementary to said first connector end. In an embodiment, the first connector end comprises a series of spring-biased or spring-loaded contact pins and a conductive ring surrounding said contact pins, and said second connector end comprises a series of conducting patches, positioned for a patch to correspond to a contact pin, and said patches surrounded by a peripheral contact surrounding said contact patches and corresponding to said conductive ring, said conductive ring and said peripheral contact provided for providing part of a Faraday cage around said contact pins and contact patches when in contact. It was found that a removable module in combination with wireless communication may give rise to problems which may be solved at least partially in this way.

In an embodiment, the back plate of said display module comprises an electrically conductive plate forming an electromagnetic shielding layer for providing a common ground for said modular electronic device. In an embodiment, the conductive back plate is from one selected from magnesium and a magnesium alloy, for providing rigidity to said display module. Furthermore, magnesium is relatively light in weight, yet relatively strong. Alternatively, another conductive metal may be used, like a stainless steel sheet of an aluminium sheet. It may also be possible to combine these metals.

In an embodiment, the modules comprise a housing comprising a front cover and a rear cover, with said rear cover comprising an electromagnetic (EM) shielding layer comprising a contact end contacting said common ground. In fact, the shielding is to shield against electromagnetic interference. In an embodiment, the at least one of the cover parts are made from a polymer composition. Often, a composition a thermoplastic material is used. In an embodiment, the polymer composition is selected from one or more of acrylonitrile butadiene styrene (ABS), polyethylene (PE), polystyrene (PS), polypropylene (PP), polyester, like for instance polyethylene terephthalate (PET), nylon, polycarbonate (PC), Polyetherimide (PEI), Polyetherether ketone (PEEK), and the like. These polymers and their use are all known to a skilled person.

In an embodiment, the said rear cover is injection moulded with EM shielding as an inlay in an inlay moulding process. Alternatively or in combination, a 3D printing process may be applied. The EM shielding inlay, for instance a stainless steel part, of a part from another metal, can provide additional strength to the housing as well as provide EMI shielding and grounding.

In an embodiment, the modular electronic device further comprises at least one antenna unit and a coaxial lead for connecting said antenna unit, said coaxial lead comprising a sheath comprising a conductive connector contacting said electrically conductive plate of said display module. In this way, more efficient use can be made of the common ground and/or common shielding. This makes positioning one or more antenna units in the electronic device easier.

In an embodiment, the modular electronic device further comprises at least one antenna unit comprising an antenna on a carrier and comprising a connection part for functionally connecting said antenna to said further modular electronic device, in particular said antenna unit comprising a connection part for further mechanically releasably connecting to said chassis. The carrier may be a substrate. The connection part may be integrated, providing both mechanical connection as well as functional connection. Such an antenna unit provides flexibility. Using for instance a flexible foil substrate, an antenna unit can be easy and low cost in production. Furthermore, replacement is easy, and for instance changing the antenna for different bandwidth or more optimized design may be possible. The substrate can be a flexible, polymer substrate. The antenna unit may be produced using laser direct structuring (LDS). Antenna units can be provided for Bluetooth, WIFI, LTE, 4G, and any other wireless communication protocol and/or frequency. In an embodiment, the antenna is provided on a plastic backed foil substrate. The foil substrate may comprise contacts. When positioned on the chassis, the contacts may be connected to one or more leads functionally connecting the antenna to the further electronic device.

The invention further relates to a display module for an electronic device, comprising a planar display unit having a display side for viewing said display and a rear side provided with a back plate comprising a conductive shield layer that is at least partially embedded in a polymer material while leaving at least part of a surface of said conductive shield layer that is directed away from said rear side free for being electrically contacted. In an embodiment the back plate comprising a display attachment part for allowing said display module to be attached a frame in a sliding manner in a sliding direction in-plane of said planar display unit. The back plate may further comprise a display lock part for in a mutually locked position locking to a frame, blocking said sliding, and in a mutually released position allowing sliding of said display module and a frame with respect to one another for allowing removal of said display module from a frame. The display module can be connected easily, and can provide common grounding and/or shielding in the electronic device. Furthermore, assembly and disassembly are possible without further tools.

The invention further relates to an electronic device comprising a data processor, a communication unit for wireless communication, a display module comprising a display, a camera module comprising a camera device, and a battery, wherein said electronic device further comprises:

a chassis comprising a frame holding a circuit board holding said data processor and said communication unit, and further comprising connectors for functionally connecting said display module to said data processor and said camera module to said circuit board and a frame attachment part for mechanically releasably connecting said display module to said frame;

said display module comprising a substantially flat display device comprising a display module back plate comprising a display attachment part, complementary to said frame attachment part for cooperating with said frame attachment part for mechanically releasably connecting said display module to said frame;

said camera module comprising a camera device and a housing;

wherein said chassis comprises an opening having a shape adapted to fit at least part of said housing of said camera module.

The shape-fitting of the module housing in the chassis, in particular in the frame, provides secure attachment. In particular, in case alignment of devices in the electronic device is of importance.

In an embodiment, the electronic device further comprising at least one selected from a receiver module comprising a speaker and a housing, said chassis comprises an opening having a shape adapted to fit at least part of said housing of said receiver module, and a speaker module comprising a speaker and a housing, said chassis comprises an opening having a shape adapted to fit at least part of said housing of said speaker module. The housing encloses the components like the speaker inside.

These further modules may comprise components that also require alignment. Furthermore, the fitting provides alignment of other parts of the module, like for instance proper alignment of connectors for functionally connecting the module to the further electronic device. Furthermore, in an embodiment the fitting may be snap-fitting. In such an embodiment, no further attachment parts may be required, and assembling and disassembling may be easier.

In an embodiment, at least one of said camera module, said receiver module and said speaker module comprises a housing comprising an integrated conductive part comprising a contact lip contacting a common grounding plane provided by a conductive part integrated with said display module back plate at a rear surface of the display module. In particular, the conductive part is insert-molded into the module housing. The insert comprises one or more contact lips.

In this way, a module is less vulnerable, making changing easier. Furthermore, it is possible to commercially provide new modules with different and adapted functionality.

In an embodiment, said chassis comprises a physical bus for coupling said modules to said data processor. In an embodiment, said circuit board comprise said physical bus comprising a series of connectors for functionally coupling said modules. This provides an easy coupling, which is physical, and provides a functional coupling, allowing said modules to operate.

The physical bus can also be provided with an expansion port for allowing functional coupling of external devices, for allowing addition of additional functional parts and/or peripherals, for instance integrated in a back cover. In an embodiment, the expansion port extends and allows coupling at a side of said circuit boars opposite to the side provided with connectors for said modules. In an embodiment, that opposite side is the back or rear side of the device.

The invention further relates to a module for an electronic device, said module comprising a housing from a polymer composition and a conductive metal part integrate in said polymer composition and providing a structural part of said housing, said metal part comprising a flexible lip extending from said housing for in an assembled condition electrically contacting to a common grounding part of said electronic device.

The flexible lip, for instance resiliently biased away from the housing, makes connecting to further parts of the electronic device easier.

The invention further relates to an electronic device comprising a data processor, a communication unit for wireless communication, and a chassis comprising a frame, said electronic device comprising a at least one antenna unit coupled to said wireless communication unit, said antenna unit comprising an antenna provided on a substrate, a connector connected with said antenna and a connecting part connected with said substrate, and wherein said frame comprises a recess for supporting said substrate, a complementary connecting part for mechanically connecting to said connecting part of said antenna unit, and a connector for connecting with said connector of said antenna unit for functionally coupling said antenna with said communication unit.

The recess on the chassis, in particular on the frame, makes it easy to change the antenna unit, and holds the antenna unit secure in place. In a more general term, the antenna is provided on a carrier, in particular on a substrate.

The invention further relates to an electronic device comprising a communication unit for wireless communication on a common circuit board and a display module comprising a display on a back plate, and a chassis comprising a frame holding said circuit board, and releasably holding said back plate, wherein said electronic device further comprises at least one antenna unit coupled to said wireless communication unit via a coaxial lead comprising a shielding cladding grounded to a common grounding on the back of the back plate of said display module. In an embodiment, the shielding cladding is grounded via a contact to the common grounding.

The invention further relates to an electronic device comprising a data processor and a communication unit for wireless communication on a common circuit board defining a computational module, a display module comprising a display, a battery, and a chassis comprising a frame holding said circuit board, and releasably coupling display module, on one side, wherein said frame holds said battery electrically coupled to said circuit board on an opposite side of said frame, and said display module comprising an engaging part engaging said battery for blocking releasing of said display module from said frame while said battery is on said frame. The engaging part in an embodiment comprises a com.

The invention further relates to an electronic device comprising a data processor and a communication unit for wireless communication on a common circuit board defining a computational module, a display module comprising a display, a battery, and a chassis comprising a frame holding said circuit board, and releasably coupling display module, on one side, wherein said frame comprises an opening for snap-fittingly holding said battery electrically coupled to said circuit board on an opposite side of said frame, and said frame and said display module comprising holding parts for holding said display module and said frame locked together, wherein said display module further comprises a cam engaging said battery blocking releasing of said display module from said frame while said battery is snapped onto said frame.

The term "substantially" herein, like in "substantially consists", will be understood by and clear to a person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

The term "functionally" will be understood by, and be clear to, a person skilled in the art. The term "substantially" as well as "functionally" may also include embodiments with "entirely", "completely", "all", etc. Hence, in embodiments the adjective functionally may also be removed. The term "functionally" is intended to cover variations in the feature to which it refers, and which variations are such that in the functional use of the feature, possibly in combination with other features it relates to in the invention, that combination of features is able to operate or function. For instance, if an antenna is functionally coupled or functionally connected to a communication device, received electromagnetic signals that are receives by the antenna can be used by the communication device.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices or apparatus herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device or apparatus claims enumerating several means, several of these means may be embodied by one and the same item of hardware. The mere fact that certain measures are recited in mutually different dependent claims does not indicate that a combination of these measures cannot be used to advantage.

The invention further applies to an apparatus or device comprising one or more of the characterising features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of an electronic device will now be described, by way of example only, with reference to the accompanying schematic drawings in which corresponding reference symbols indicate corresponding parts, and in which is shown in.

Figure 1A:
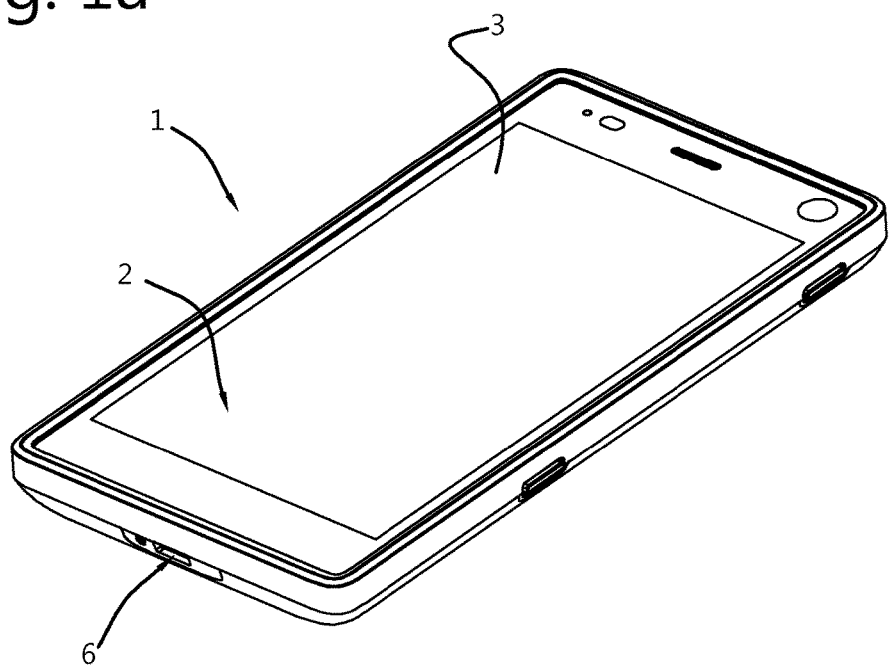
FIG. 1a, 1b schematically an electronic device in front and rear view in perspective.

The drawings are not necessarily on scale.

DESCRIPTION OF PREFERRED EMBODIMENTS

In the drawings, the same reference numbers indicate the same of functionally the same parts. Not all the parts are indicated in every drawing.

Figure 1B:
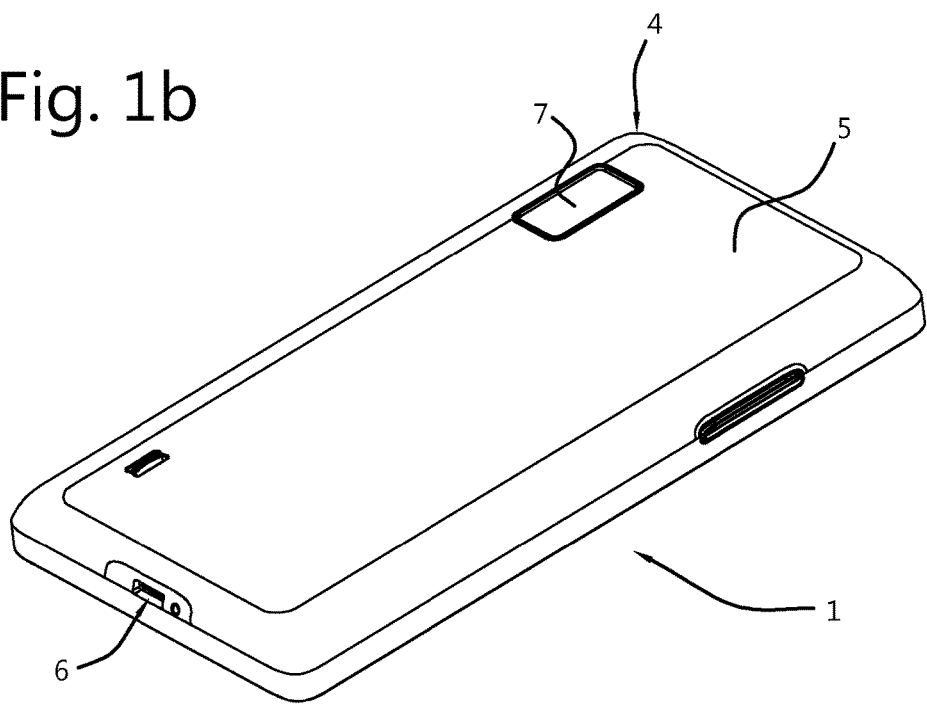

FIG. 1a schematically depicts an electronic device 1 in front view and FIG. 1b in rear view. Here the electronic device 1 is a portable device, more in particular a handheld device, specifically a mobile phone, also referred to as a "smart phone". As explained above, the electronic device 1 can also be a tablet, for instance. The electronic device 1 has a display side 2, provided with a display 3. The electronic device 1 here has a power connector 6, suited for data and/or power for providing the electronic device 1 with electrical power. Here that connecter 6 is provided at the lower end of the electronic device 1.

The electronic device 1 further has a rear side 4 opposite the display side 2 and which is provided with a back cover 5. The back cover 5 is provided with an opening or an optical window 7 for a camera.

The display 3 in this embodiment is planar. The display 3 defined a display plane.

Figure 2:
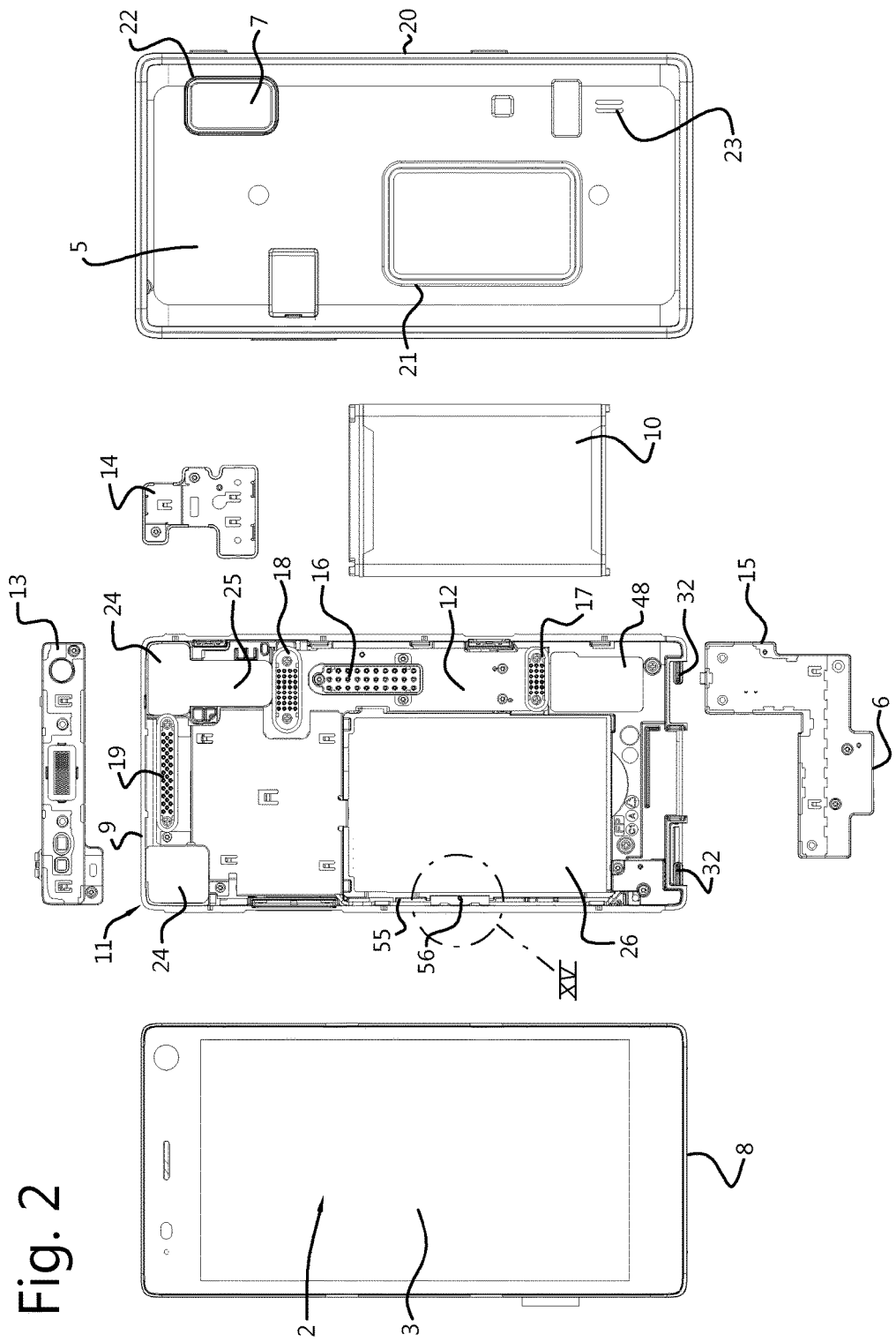
FIG. 2 schematically the electronic device of FIG. 1 taken apart.
Figure 3:
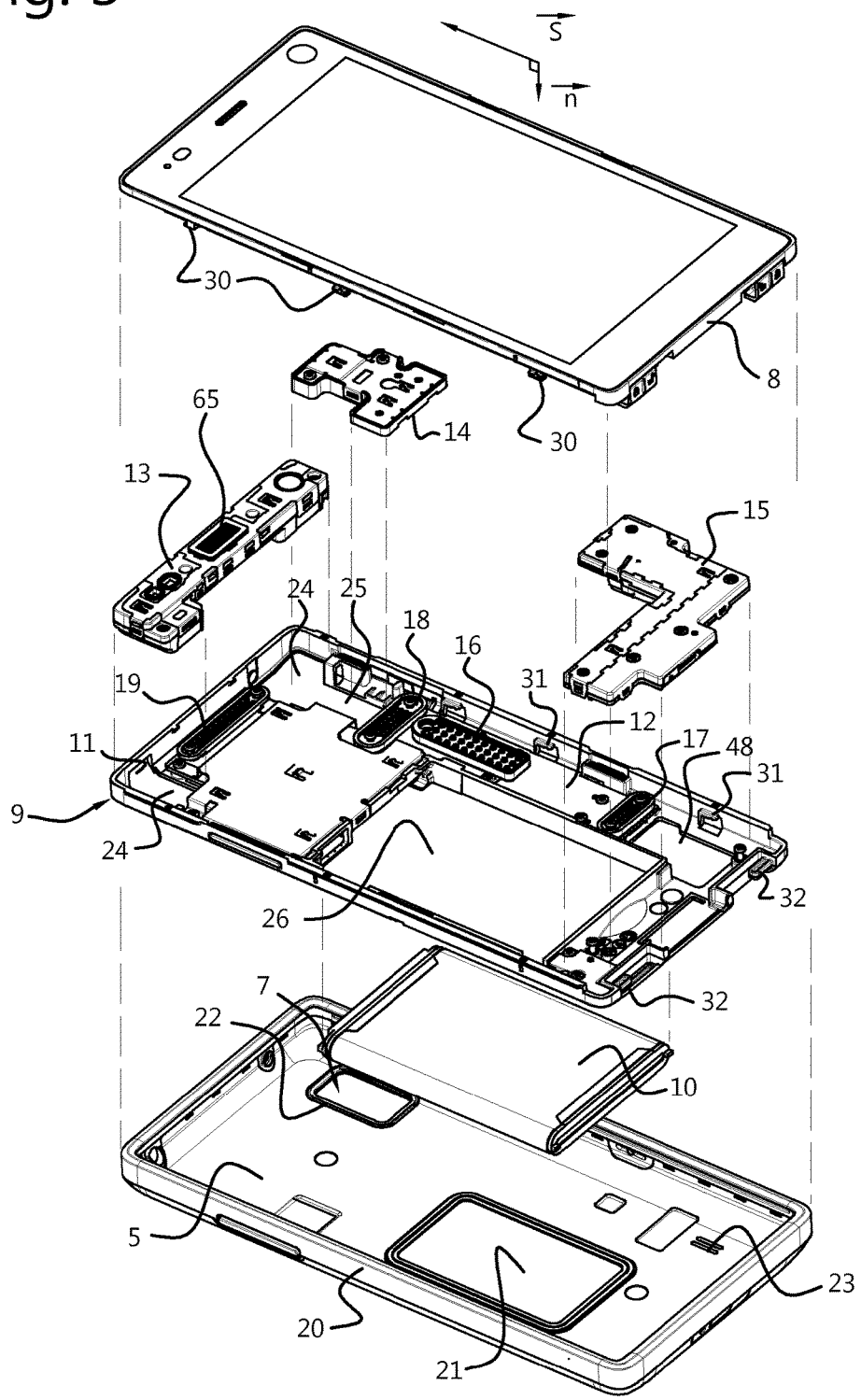
FIG. 3 schematically the electronic device of FIG. 1 in exploded view, seen from the front side or display side.
Figure 4:
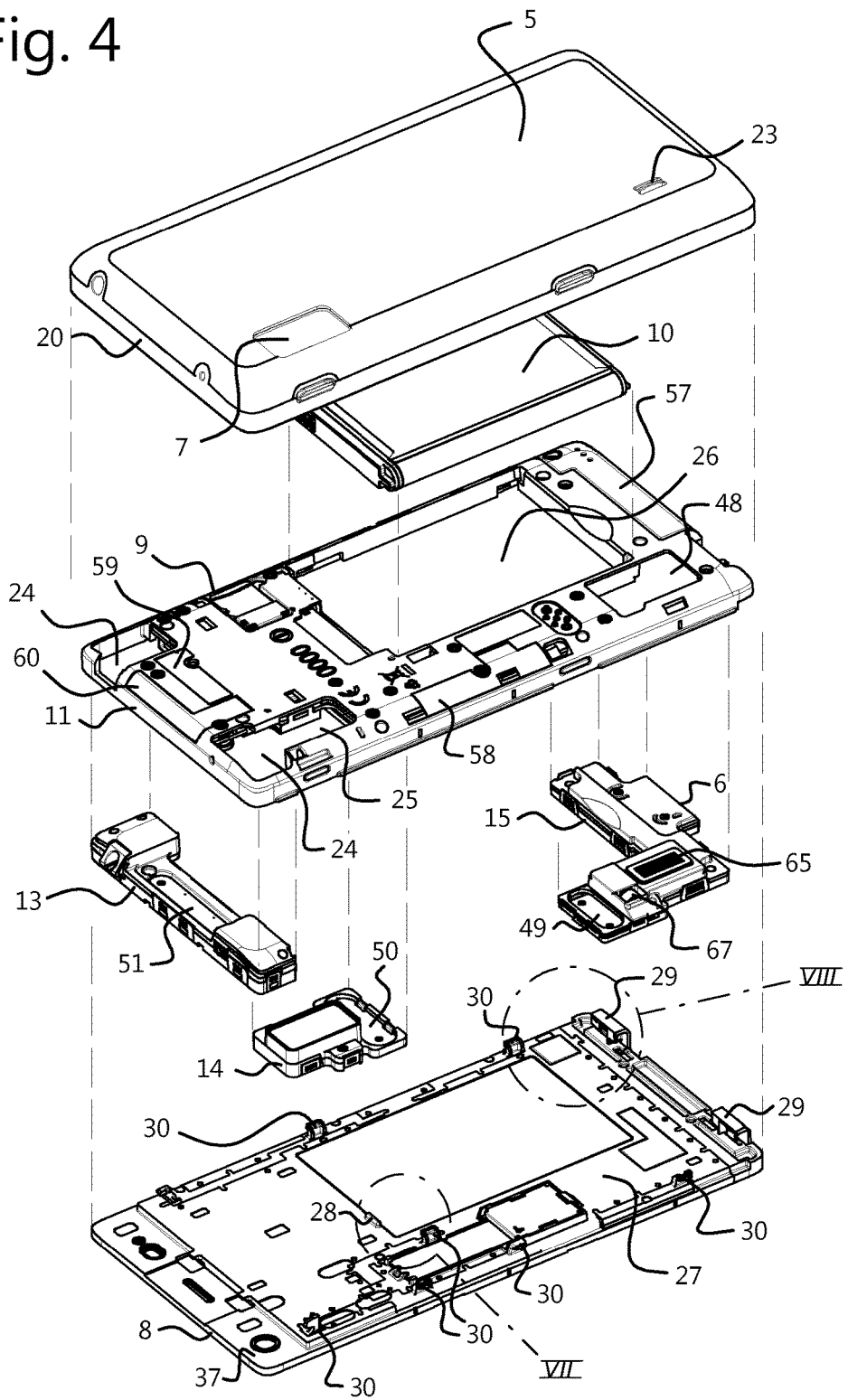
FIG. 4 schematically the electronic device of FIG. 1 in exploded view, seen from the rear side or back cover side.

FIG. 2 schematically shows the electronic device 1 of FIGS. 1a and 1b taken apart. The electronic device 1 has a modular structure in which several components are grouped together into modules, as explained earlier. These modules can be removed and replaced, repaired and/or upgraded individually. FIG. 2 shows the various modules, back cover 5, chassis 9 and battery 10 all from their side that in assembled condition is directed to the display side 2 of electronic device 1. FIG. 3 schematically shows the electronic device 1 of FIG. 1a, 1b in exploded view, seen from the front side or display side 2, and FIG. 4 schematically shows the electronic device 1 of FIG. 1 in exploded view, seen from the rear side 4 or back cover side. Thus, the rear side 4 of each module (in assembled state) can be seen. Some parts are shown in more detail in the indicated FIGS. 7, 8, 15, here indicated in the Roman numeral system, and will be discussed later. The electronic device 1 comprises a display module 8. The electronic device 1 further comprises a chassis 9. Here, chassis 9 comprises a frame 11 that is provided with a circuit board (usually a printed circuit board or PCB) 12 that is attached to the frame 11 and forms a computation and communication module with the components that are attached to it, like a data processor, a communication unit, and various connectors. Battery 10 is here snapped onto frame 11 and is in electrical contact with the circuit board 12 for providing electrical power to the electronic device 1 when it is not coupled to a power supply via power connector 6. Usually, the circuit board is a printed circuit board, although other circuit board and functionally similar implementations may be possible.

The electronic device 1 here comprises a receiver module 13 which will be discussed in more detail later. The electronic device further comprises a camera module 14. The electronic device here further comprises a speaker module 15. All these modules will be discussed later in more detail.

In this embodiment, the circuit board 12 is provided with connectors 16, 17, 18, 19 for electrically connecting each of the modules 8, 13, 14, 15 to the circuit board 12 in order to provide a functional coupling which is here is in a physical manner. The connectors 16, 17, 18, 19 comprise substantially in a direction of the rear side compressible electrical contact pins. The connectors will be discussed in more detail later.

In FIGS. 2 and 3 the inner surface of the back cover 5 can be seen. Around the camera opening 22 a sealing rim is provided which here seals against ingress of dirt and moisture at the camera module 14 location. The back cover is further provided with a pressure rim 21 for in a mounted state of the back cover 5 pressing against the rear surface of the battery 10. The back cover 5 is further provided with a flexible, resilient rim 20 which fits round the circumference of the display module 8 and reaches to the display side 2.

Figure 6:
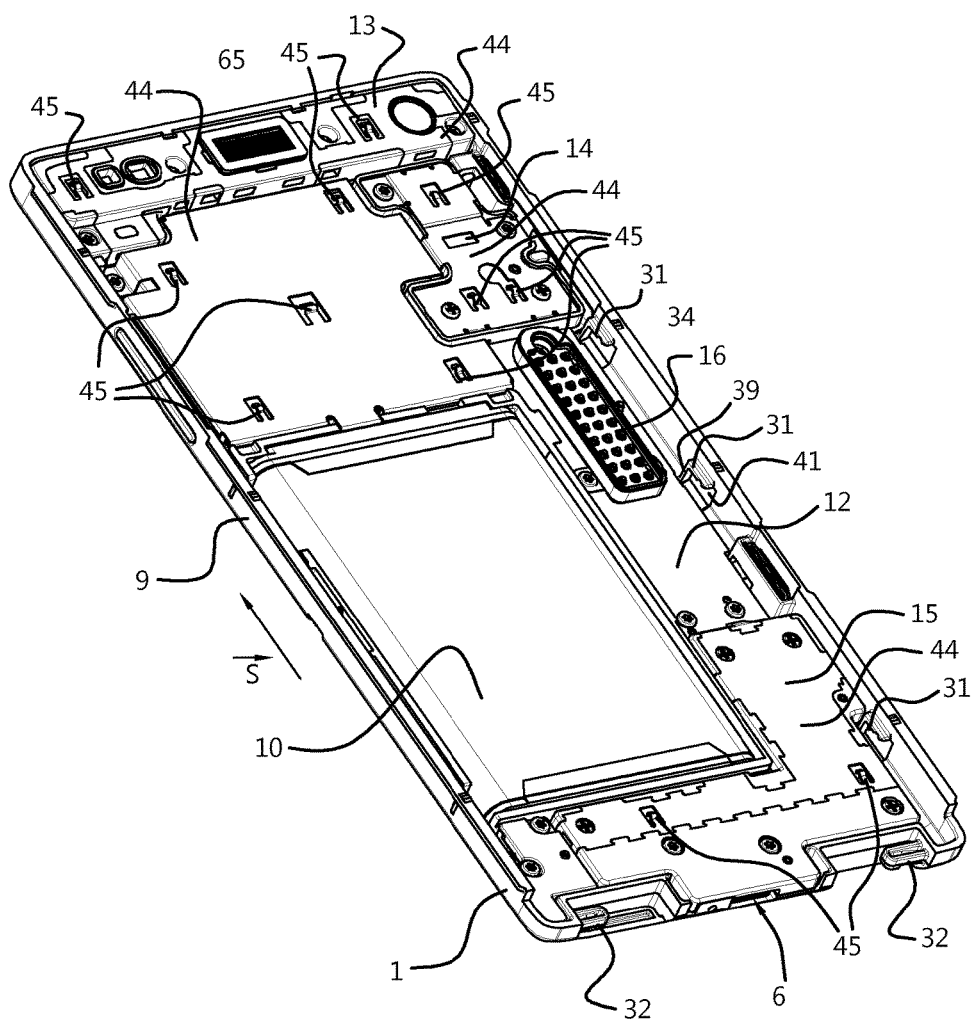
FIG. 6 schematically a rear view of a chassis of the electronic device of FIG. 1 in perspective view from the display side, and a detail as indicated.
Figure 9:
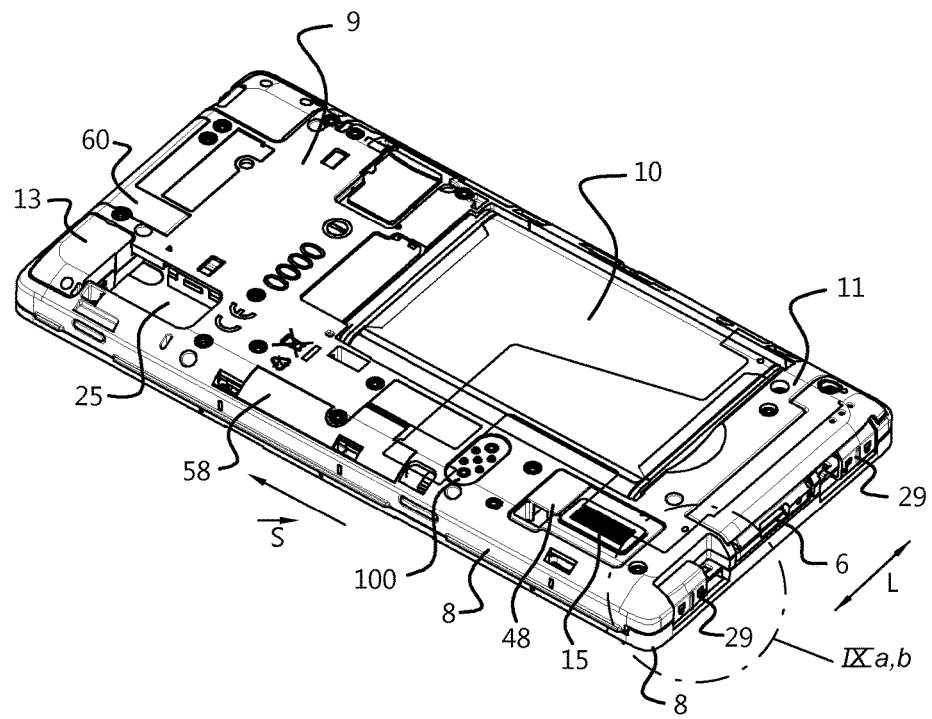
FIGS. 9, 9a, 9b schematically a rear view in perspective of the electronic device of FIG. 1 with a back cover removed, and details as indicated in FIGS. 9a and 9b.

FIG. 1 shows this. In this way, the back cover 5 seals the electronic device 1 against ingress of dust, dirt and moisture. The current electronic device 1 thus needs no further cover, like known electronic devices require or often have. In an embodiment, the central part of the back cover 5 is from a plastic material, comprising a flexible, resilient rim 20 of an elastomeric material. The back cover 5 may be produced in a bi-component moulding process, or for instance in a multi-component 3D printing process. The ingress protection seals in an embodiment prevent water and dust ingress. In FIG. 6 (and FIGS. 9, 13 and 14, and a part in FIG. 9a next to arrow S, for instance), it can be seen that the frame 9 has additional rails at its sides just above the line end of reference 9. These rails allow attachment of an alternative sliding back cover 5. It can snap behind the end of the rails. The rails extend parallel to direction S at both opposite sides of the frame 9, as shown in FIG. 9.

The frame 11 of the chassis comprises several provisions for positioning modules, and for keeping the modules positioned.

To that end, the frame 11 comprises here two receiver module openings 24, having a shape that is adapted to at least part of the shape of the receiver module 13. In the embodiment, the receiver module 13 can be positions into place with its two extremities fittingly positioned in the openings 24. For further fixing, the receiver module 13 has holes for fitting screws for attaching the receiver module 13 to the frame.

The frame 11 further comprises a camera module opening 25, again having a shape that is adapted to at least part of the shape of the camera module 14. This again allows positioning into place in a secure manner, preventing wrong assembly and securing the camera module 14 in position on the frame 11. Also the camera module has two openings for fitting screws for fixing the camera module onto frame 11.

The frame 11 further comprises a battery opening 26 for holding battery 10. It comprises wall elements and lips (see FIG. 4) working together for snap-fittingly holding battery 10 into position in opening 26 of frame 11. The battery 10 in assembled state of the electronic device 1 is further held between the back cover battery pressure rim 21 end the rear surface of display module 8. The display module is here positioned onto frame 9 in a sliding motion, sliding the display module 8 down (to the lower part of the paper). It was found that removing the display module from the frame 11 while the battery 10 was still electrically connected to the circuit board 12 can be harmful to the electronic device 1. In order to prevent removal of the display module 8 from the chassis 9, in particular from frame 11, a cam 28 is provided on the rear surface of display module 8. Cam 28 is positioned to abut battery 10 when display module 8 is slid with respect to frame 11 with battery 10 fitted to the chassis 9. Cam 28 is shown in more detail in FIG. 7. The relatively small cam 28 proved to be sufficient to prevent sliding of the display module 8 when the battery 10 was in place.

Figure 5:
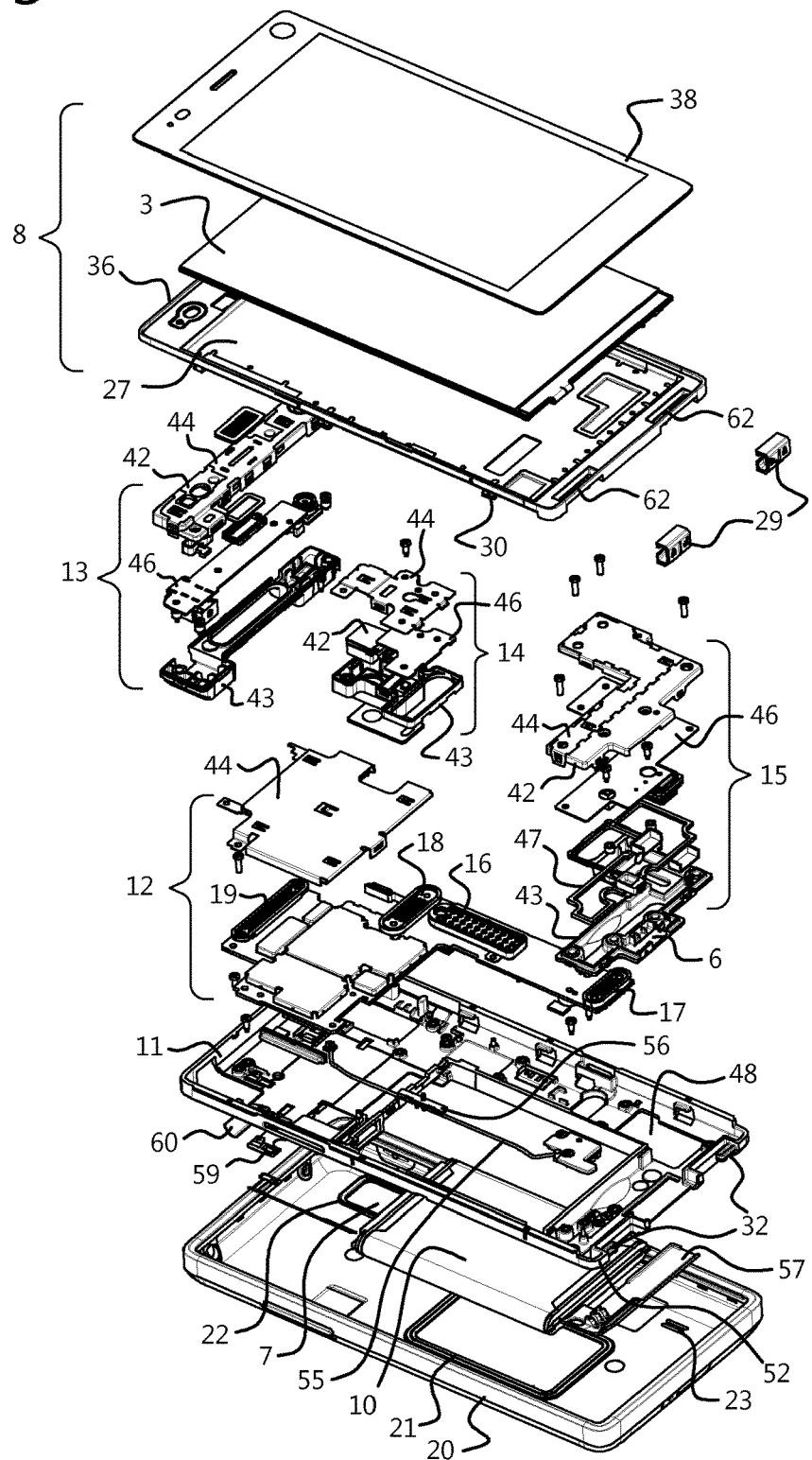
FIG. 5 schematically the electronic device of FIG. 1 in complete exploded view, seen from the front side or display side.

FIG. 5 schematically the electronic device of FIG. 1 in complete exploded view, seen from the front side or display side 2.

Display module 8 in this embodiment comprises a display 3 with a touchscreen. This configuration as such is common in so called smartphones. The display 3 or display device is substantially planar. The display 3 can be an LCD display, an OLED display, or any other type of display 3 known to the skilled person and used in electronic devices, in particular electronic devices like mobile phones, tablets, notebooks, and the like. The display module 8 further comprises in this embodiment a protective glass plate 38. This protective glass plate may comprise a touchscreen. The display module also or in stead comprise a touchscreen sensor, which may be integrated in the display 3 in the case of in-cell sensing, or through he use of an additional sensing layer between the display 3 and the protective glass plate 38

At its rear, the display module comprises a display module back plate 36. This back plate 36 has various functions. It provides strength, rigidity and means for attaching the display module 8 to the frame 11 of chassis 9. The back plate 36 comprises a reinforcement part which in that embodiment is from a conductive material. Thus, in this embodiment it provides both stiffness to the display module as a equipotential plane. In the current design, the conductive back plate part 27 is a magnesium plate. In the current embodiment the conductive back plate part 27 integrated into the display module back plate 36 via an insert-moulding process. The conductive back plate 27 is placed as an insert in an insert-moulding or double moulding process and the further display module back plate 36 is injection moulded around is, leaving the back surface of the conductive back plate part 27 free for electrical connection to the various further modules of the electronic device.

In the current embodiment, the display module back plate 36 comprises a circumferential rim 37. This circumferential rim 37 here fits around the display 3 and around the protective glass plate 38.

Indicated in FIG. 5 and also in FIG. 2 are furthermore display attachment parts 30. One of these display attachment parts 30 is also in more detail visible in FIGS. 7 and 8. These display attachment parts 30 work together with frame attachment parts 31. These frame attachment parts 31 are indicated in FIG. 3 and in FIG. 6 in detail.

Figure 7:
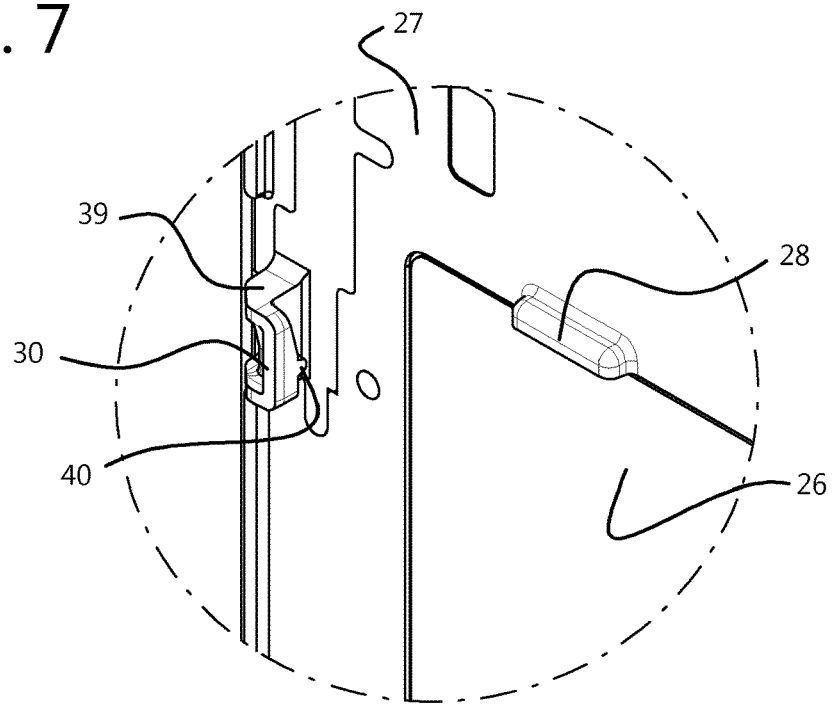
FIG. 7 schematically a detail of the rear of a display module as indicated in FIG. 4.
Figure 8:
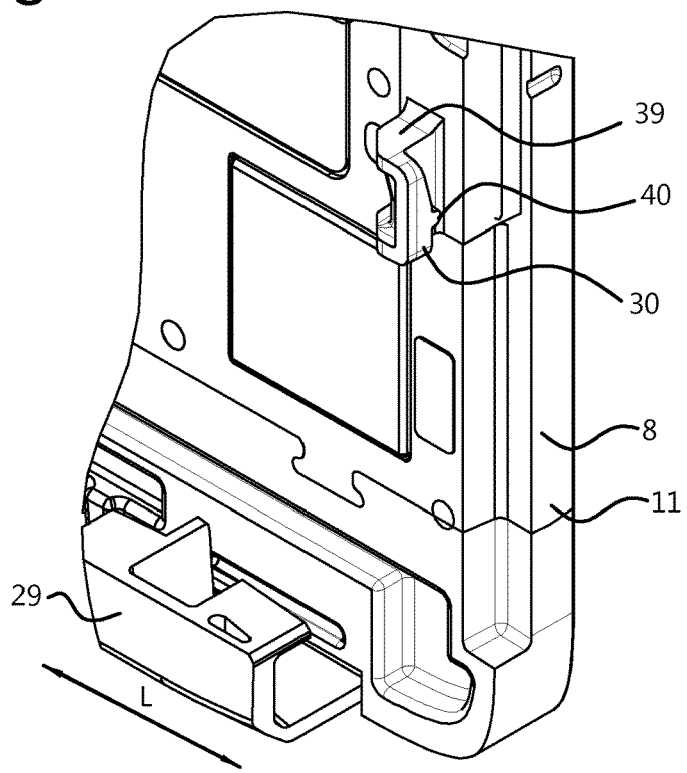
FIG. 8 schematically a further detail of the rear of a display module as indicated in FIG. 4.

An embodiment of the display attachment part 30 is depicted in more detail in FIGS. 7 and 8. The display attachment part 30 provides an abutment in a direction cross with respect to the display 3. This abutment of display attachment part 30 works together with an abutment.

In an embodiment, the display attachment parts 30 provides hook elements, and the frame attachment parts 31 provides a complementary hook elements. With the display module slid into place on the frame 11 with its display attachment parts 30 engaging the frame attachment parts 31 of frame 11, the hook elements and complementary hook elements provide mutual abutment in a direction perpendicular with respect to the display 3 and perpendicular to the frame 11. Thus, the display module 8 is locked to the frame 11 in a direction perpendicular to the display. Furthermore, the hook elements and complementary hook elements provide mutual abutment in a direction in the plane of the display 3 and perpendicular to the slide direction. In this way, the display module 8 and chassis 11 are furthermore locked in those directions. Furthermore, at least one selected from at least one of the display attachment parts 30 and at least one of the frame attachment parts 31 provides a slide abutment 39 (FIG. 6). Slide abutment 39 blocks (further) sliding of the display module 8 and the chassis 9 with respect to one another. At that position, the display module 8 and the chassis 9 are properly aligned. In the current embodiment, a slide abutment 39 is indicated in the detail of FIG. 6, here provided on the frame 11. One of the frame attachment part 31 will abut that slide abutment 39.

In the current embodiment, the hook element and the complementary hook element comprise a cam 40 and notch 41 (FIGS. 6, 7 and 8) which provide an snap-lock when the display module and chassis 11 are properly aligned.

Indicated in FIG. 5 are furthermore display module locking latches 29. In FIG. 4 the display module locking latches 29 are shown mounted in the display module 8, in particular on the display module back plate 36. In FIG. 8 the display module locking latch 29 is shown in detail, and in FIG. 9 the display module locking latch 29 is shown in a locked position when locking the display module 8 onto frame 11 of the chassis. The arrow in FIG. 9 indicates the latching direction L of the display module locking latch 29, for bringing the display module locking latch 29 into a released position. In its locked position (in FIG. 9), the display module locking latch 29 engages frame lock cam 32, indicated in FIGS. 2 and 3, and in FIG. 6 in more detail.

The display module locking latch 29 provides a display lock part and the corresponding frame lock cam 32 provides a frame lock part.

The display module locking latch 29 here runs on a rail end provided on the display module 8. The rail end is provided at an end of the display module 8. It runs cross, in particular rectangular, to the display slide direction S. FIGS. 8-9b show this in more detail.

When attaching display module 8 onto the chassis 9, the following is done. It is assumed that the other modules are already placed on the chassis 9.

The display module is placed on top of the frame 11, with its conductive plate towards the frame and its display side away from the frame 11. The display module 8 is not placed exactly on top of frame 11, but a little displaced in the direction opposite to the slide direction S. The user now slides the display module in the slide direction S, with the display attachment parts 30 snapping onto the frame attachment parts 31. The display module 8 slides until it engages one or more of the slide abutments 39. Now, the two display module locking latches 29 of this embodiment are slid in outward direction (the slide 29 of FIG. 8 to the right) until they slide over the corresponding frame lock cams 32 of frame 11. Now, the display module 8 can no longer slide back. The display module 8 is locked onto chassis 11.

To remove the display module 8 from an electronic device 1, first back cover 5 needs to be removed. Next, battery 10 needs to be removed as it blocks display module 8 via cam 28. Now, the two display module locking latches 29 need to be slid inwardly. Now, the display module 8 can slide in direction S in the display plane. Display module 8 usually slides only a few mm, for instance 1-15 mm, in particular 1-5 mm. The respective attachment parts 30 and 31 disengage and the display module 8 can be lifted off of the frame 11 and off of the chassis 9.

FIG. 6 schematically shows a rear view of the chassis 9 of the electronic device 1 of FIG. 1 in perspective view from the display side 2. On the chassis 9, the receiver module 13, the camera module 14, the speaker module 15 and the battery are installed. The display module 8 is removed. Normally, is configuration with battery 10 in place is not possible, as the presence of battery 10 prevents removal of the display module 8 as explained earlier.

FIG. 6 shows a front view of the electronic device 1 with the display module 8 removed but with the battery 10 re-added. Here, a display connector 16 is shown. Functionally alike connectors 17, 18 and 19 are used for functionally coupling other modules. The connectors 16, 17, 18, 19 comprise a series of contact pins 34 (only two specifically indicated) that comprise contacting ends that are biased in the display direction. In the embodiment shown in the figures, so called 'pogo pins' 34 are used to that end. A Pogo pin 34 is known in general and relates to a device that can be used in electronics to establish a (usually temporary) connection between two printed circuit boards. A pogo pin 34 here takes the form of a slender cylinder containing one or two spring-loaded pins. Pressed between two electronic circuits, the contacts or tips at each end of the pogo pin 34 make secure contacts with the two circuits and thereby connect them together. In the current invention, single spring pogo pins are employed with one end of the pogo pin being electrically connected to a circuit board. In order to prevent the series of contacts to radiate electromagnetic radiation, the series of contacts of a connector are enclosed by a shielding ring 35 of conductive material. In the current invention, the opposite connector end comprises a series of corresponding contact patches, positioned for a patch to correspond with a contact pin 34. The contact patches are surrounded by a closed, ring-shaped shielding patch surrounding the contact patches. This is not shown in the drawings.

Thus, one end of a connector 16, 17, 18, 19 comprises a series of pogo pins 34 enclosed by a shielding ring or rim 35 of conductive material. The other end of the connector comprises a series of contact patches that correspond to the series of pogo pings and a closed, ring-shaped shielding patch surrounding the contact patches and corresponding to the shielding ring 35 of conductive material. The contacting shielding patch and the shielding ring together form part of a Faraday cage around contacting contact pins 34 and corresponding contact patches (not shown)

In FIG. 6 are furthermore rail parts 33 indicated on the longitudinal sides of frame 11. These rail parts 33 can work together with parts of a back cover to provide a slide-on cover. In the current drawings, the back cover 5 that is shown is of the "snap-on" type that snaps around the complete sides of electronic device 1. The back cover 5 here thus seals against the front surface or display side 2 of the display 3.

In FIG. 6 it is furthermore shown how all the modules, like the receiver module 13, camera module 14, speaker module 15 and the computational module, are all provided with a module ground plate 44. The module ground plates 44 all comprise one or more module ground contact lip 45. These contact lips 45 are flexible in a direction normal to the grounds plate 44. The contact lips here all extend in one plane. When a display module 8 is attached to frame 9, the contact lips 45 will contact the conductive back plate 27 of the display module 8. In this way, all the modules of the electronic device have a common ground. Furthermore, the ground plates 44 shield the modules at least partly from electromagnetic interference.

FIG. 7 schematically shows a detail of the rear of a display module 8 as indicated in FIG. 4. It shows in detail the battery blocking cam 28 that engages the battery 10, in particular a side or ledge of the battery. This prevents the display module 8 to be slid in its display slide direction S. Thus, a display module 8 can not be removed from frame 11 as long as a battery 10 is in place. In this way, strong voltage changes on the other components/modules can be prevented.

FIG. 7 further shows an embodiment of a display attachment part 30. It comprises a cam 40 that allows a snap fit with the notch 41 in a corresponding frame attachment part 31. The display attachment part 30 has a complementary slide abutment 39 that abuts the slide abutment 39 of the frame attachment part 31. Thus, the display module 8 and chassis 9 can slide until they are mutually aligned.

FIG. 8 schematically shows a further detail of the lower part of the rear of a display module 8 as indicated in FIG. 4. In this detail, as well as in the detail of FIG. 7, one of the display attachment parts 30 is shown.

In FIG. 8, in more detail the locking latch 29 is shown. The locking latch 29 can be seem further in FIGS. 9, 9a and 9b. The locking latch 29 works together with frame lock cams 32. The locking latch 29 runs on a rail 62 provided on the frame 11, as can be seen in FIG. 8. The rail 62 is aligned parallel to the latch directions indicated with arrow L, that indicated that the locking latch 29 can move back and forth. The rail 62 and slide directions are here perpendicular to the display slide direction S. The frame 11 is provided with a lip that extends in the direction of the rail 62. The lip is provided with a frame lock cam 32. The lip is flexible in a direction perpendicular to the lock direction L and to the slide direction S. In operation, the locking latch 29 can be moved from an unlocked position in FIG. 9b to a locked position in FIG. 9a. When moving from the unlocked position to the locked position, the lip will bend in the direction of the display module 8. When the locking latch 29 is in the locked position, the cam 32 on the lip will snap in a notch (not visible) of behind a ledge in locking latch 29.

Figure 9A:
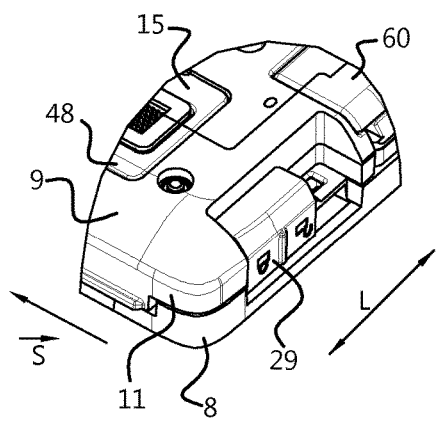
Figure 9B:
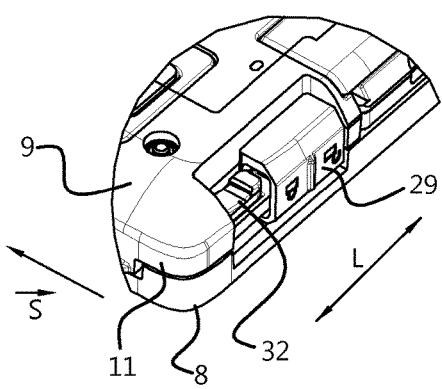

FIG. 9 schematically shows a rear view, in perspective view, of the electronic device 1 of FIG. 1 with a back cover removed, and details as indicated, shown in FIGS. 9a and 9b. In FIG. 9, the camera module 14 has been removed, showing a camera module opening 25 in the chassis. This opening 25 and part of the shape of the camera module 14 are adapted to one another in order to further hold the camera module 14 in place on the chassis 9.

In FIG. 9, an expansion port 100 is indicated. This expansion port 100 is coupled to the printed circuit board of the computational module 12. In the current modular design, such an expansion port can be added easily. In fact, on the printed circuit board a (physical) bus is formed onto which for instance the connectors 16-19 are also attached and coupled. The expansion port 100 extends here to the opposite side, providing a coupling possibility at the rear side 4. In this modular design, integration of the expansion port 100 is relatively easy. And when removing the protective back cover 5, the expansion port 100 becomes easily accessible. The expansion port 100 may provide at least one of for instance bi-directional data connectivity, for instance via a standard USB interface, power output, for instance to electronics in the back cover 5, or power input, like via a power source in the back cover 5, e.g. an additional battery pack or solar charger to charge the phone's internal battery.

The expansion port 100 in an embodiment comprises flexible contacts, for instance the already mentioned pogo pins.

This way, additional functionality can be added by changing the back cover 5. For instance, the back cover can be provided with a power source like additional battery and/or solar panel, or even an additional display, like an e-ink or OLED screen, or other peripherals like sensors like for instance a motion sensor, a temperature sensor, a pressure sensor, a contact/touch sensor, a gas sensor, peripherals like LEDs, like external data carriers like for instance SD Card connectors, like additional speakers, or like biomedical scanners like fingerprint scanner, and the like, and combinations thereof.

These peripherals may also be coupled to the expansion port in an alternative way.

In FIGS. 10-13 various modules will be discusses. Most of the modules comprise a housing. Here, the housings have a front housing part 42, a rear housing part 43, and a shielding plate 44. Often, the modules are provided with a module circuit board 46. The housing parts are commonly injection moulded, but may also be 3D printed, for instance. The shielding plate 44 is a conductive plate, often a metal plate, like a thin stainless steel or other sheet metal. The conductive plate can be thin. It may be integrated to the or with the front housing part, for instance in the 3D printing process polymer material may be printed on the conductive plate. When injection moulding, the conductive plate may be an inlay in the mould.

In the embodiments shown, the shielding plate 44 has assembly lips 54 that snap behind cams on the housing parts. The shielding plates 44 of the modules provide shielding, but also a common ground plane together with the conductive back plate part 27 of the display module 8. In fact, the display module here has a housing formed by the protective glass plate 38 on the front and the display module back plate 36 on its rear side. Integrated in the display module back plate 36 is a conductive back plate part 27. It is integrated into the further material of the display module back plate 36. For instance, using 3D printing of polymer material around the conductive back plate 27, or for instance using the conductive back plate 27 as an inlay in a mould in an injection moulding process. Here the conductive back plate 27 is functionally coupled to one end of the battery 10 for providing a common ground. All the shielding plates 44 of the modules comprise one or more module ground contact lips 45 that are here formed out of the plate material. These lips 45 are flexible and biased towards (when installed) the conductive back plate 27 of the display module. When the modules are installed and mounted on the chassis 9, the module ground contact lips 45 press against the conductive back plate 27 of the display module 8.

Various modules will be discussed in more detail in FIGS. 10-13.

Figure 10:
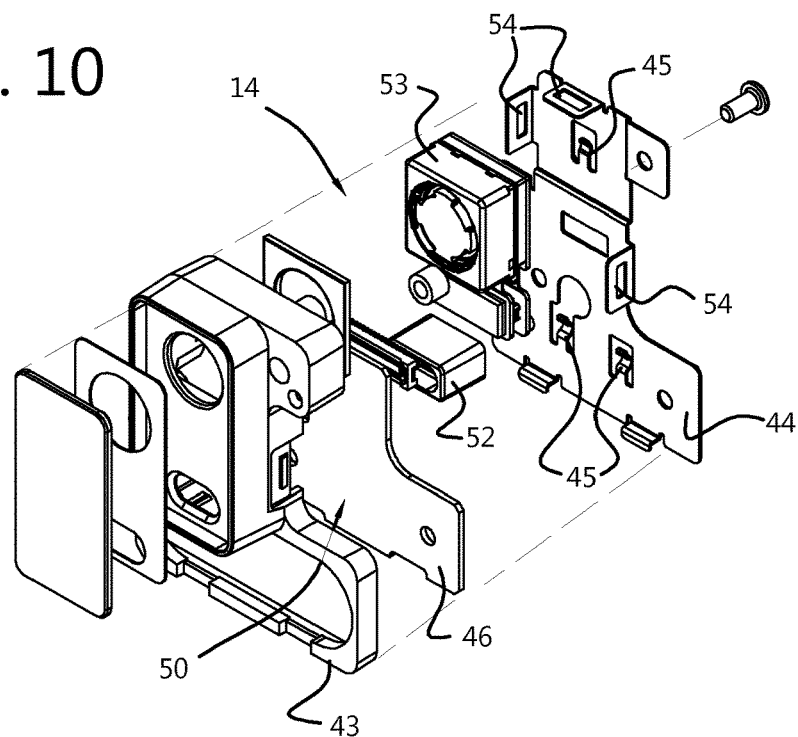
FIG. 10 schematically an exploded view of a camera module of the electronic device of FIG. 1.

FIG. 10 schematically shows an exploded view of a camera module 14 of the electronic device 1 of FIG. 1. It is shown from its rear side. The camera module 14 here comprises a rear-viewing camera. The camera module comprises a camera device 53. Such a camera is known to the skilled person, and may comprise a CMOS and/or CCD camera or the like. The camera module 14 further comprises a flash device 52. Usually, the flash device comprises one or more LED components. The components of the camera module are housed in a housing, as explained earlier. The housing comprises a part that has a shape adapted to fit into a dedicated opening in the chassis 9.

Figure 11:
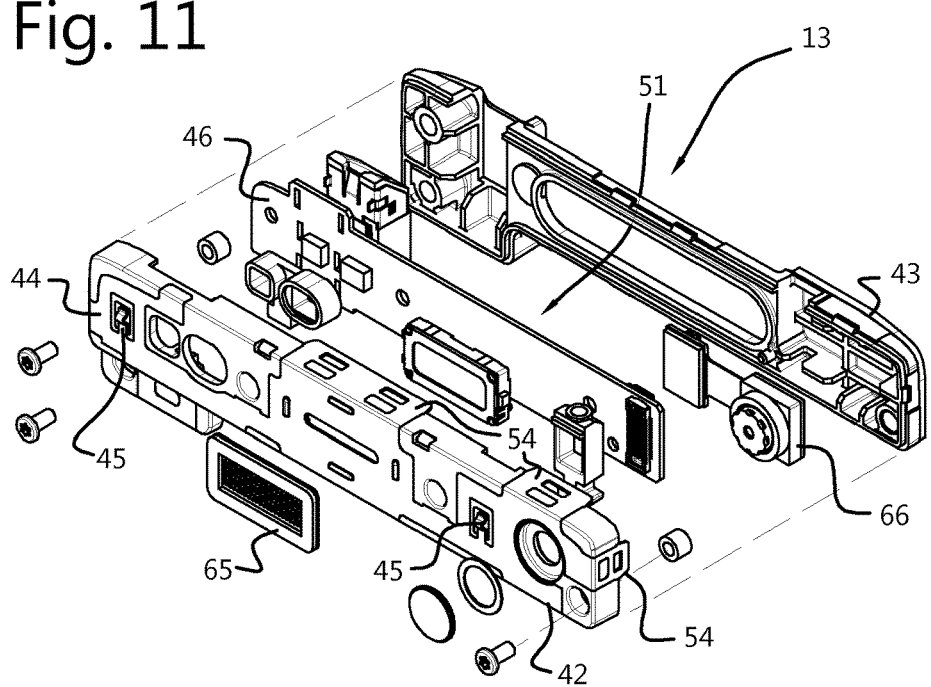
FIG. 11 schematically an exploded view of a receiver module of the electronic device of FIG. 1.

FIG. 11 schematically shows an exploded view of a receiver module 13 of the electronic device 1 of FIG. 1. In this embodiment, the receiver module comprises a speaker (receiver) which acts as an earpiece speaker 65, and also may provide hearing aid coupling. Here, the receiver module further comprises a speaker 65, a front-viewing camera device 66, a light sensor, and a jack for an earpiece or headset. The receiver module like other modules comprises a housing with shielding/grounding provisions. The housing comprise a housing part shaped to fit an opening in the chassis. Here, the receiver module has two housing parts that are shaped to fit two openings in the chassis, in particular in the frame.

Figure 12:
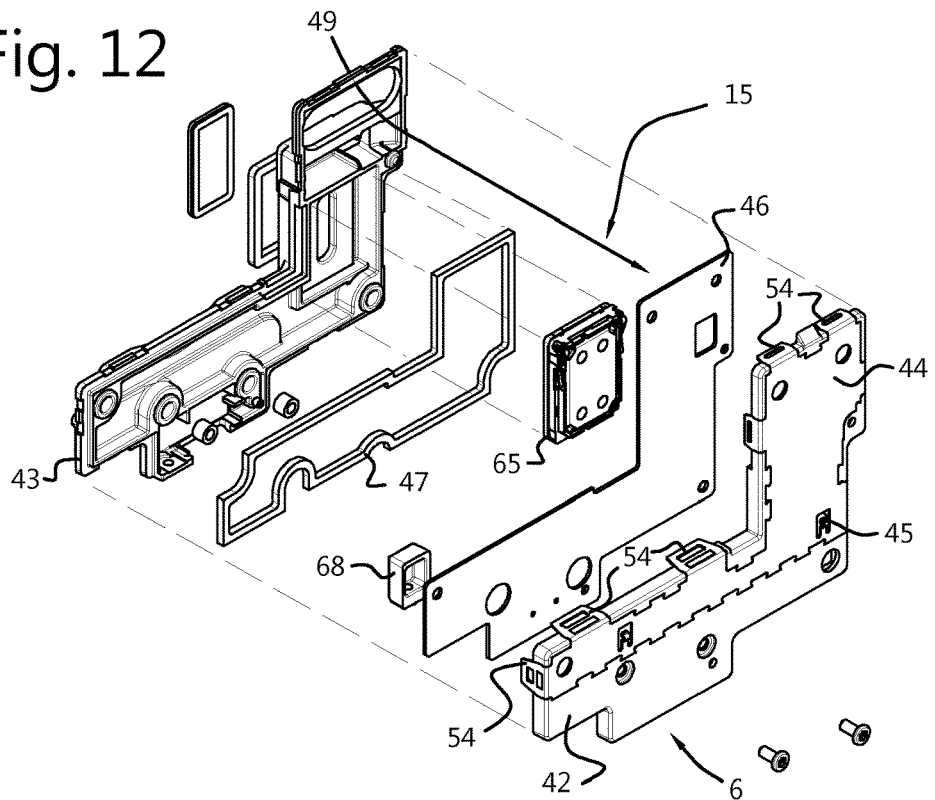
FIG. 12 schematically an exploded view of a speaker module of the electronic device of FIG. 1.

FIG. 12 schematically shown an exploded view of a speaker module 15 of the electronic device 1 of FIG. 1. The speaker module here comprises a speaker 65. In the current embodiment, the speaker module further comprises a vibrator 67 (see FIG. 3) a power connector 6 for the mains/charging, the main microphone 68 and a rubber booth around the microphone 68. The speaker module comprises a speaker module sealing 47.

Figure 13:
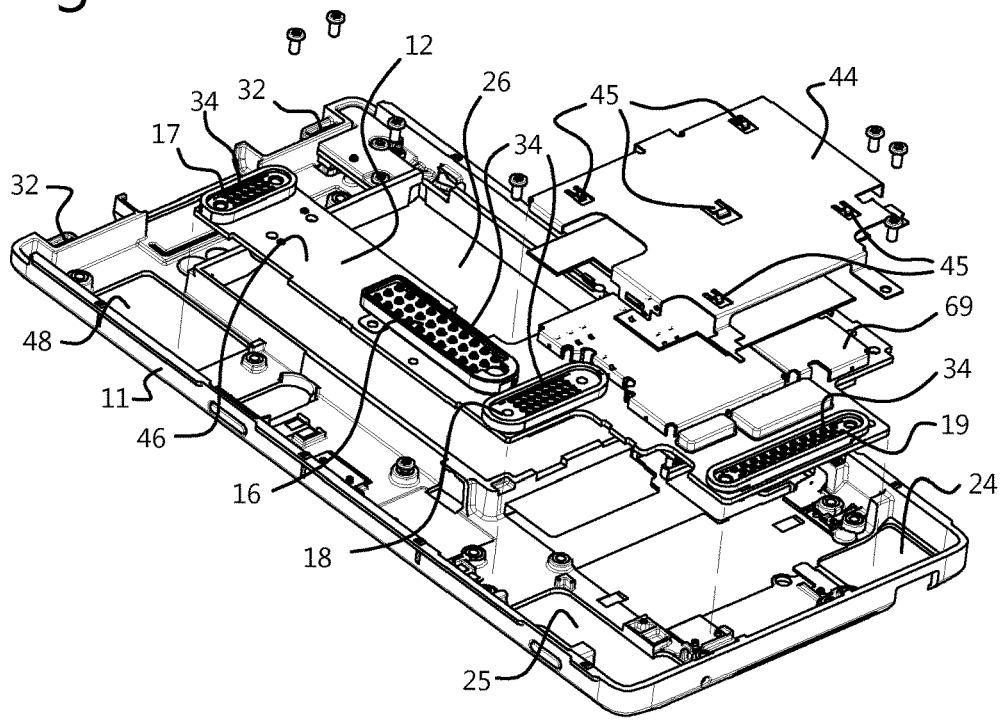
FIG. 13 schematically an exploded view of a chassis of the electronic device of FIG. 1.

FIG. 13 schematically shows an exploded view of a chassis 9 of the electronic device 1 of FIG. 1. Here, the computational module 12 is shown in an exploded view.

The computational module 12 comprises a module circuit board 46. Here, for the computational module 12 the module circuit board 46 is extended. The extended circuit board provides a logical bus for coupling modules to the computational module 12. Thus, the extended circuit board comprises the various connectors 16-19 described above.

Another aspect than makes the computational module different from the other modules is that it comprises components, in particular integrated circuits like for instance a data processor, which produce relatively much heat at a relatively small surface area. To that end, part of the housing of the computational module 12 has integrated thermal passive cooling provisions. In this embodiment, first a heat pipe foam is placed on the most heat dissipating components, like the data processor. This to spread the heat quickly to a larger area. Next, a heat conductive layer holds the heat pipe foam on its place. This heat conductive layer is in thermal contact with the heat pipe foam.

Finally, a graphite layer 69 is provided in thermal contact between the module shield plate 44 and the heat conductive layer. This setup dissipates and spreads the heat over a larger area as fast as possible.

Figure 14:
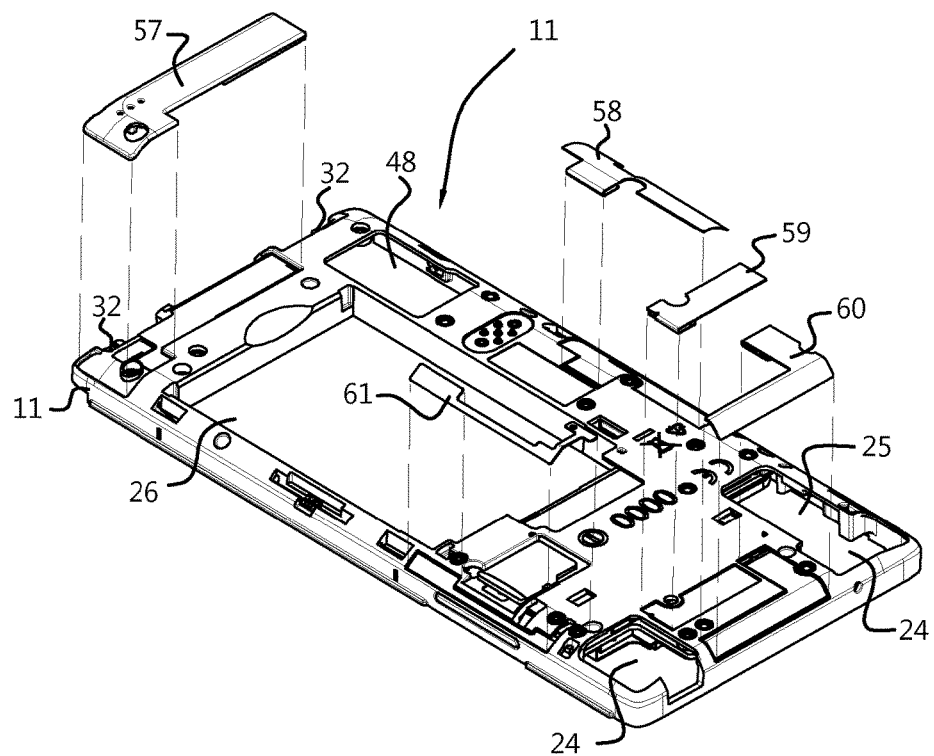
FIG. 14 schematically an exploded view of the electronic device of FIG. 1 showing the various antennas.

FIG. 14 schematically shows an exploded view of the electronic device 1 of FIG. 1 showing the various antenna units 57, 58, 59, 60, 61. Here, the device comprises the following antenna units:

57 main cellular antenna for GSM, WCDMA and LTE;
58 WIFI/BT antenna;
59 MIMO (multiple-input and multiple-output) high band antenna;
60 GPS antenna;
61 MIMO low band antenna;

Except for the main cellular antenna 57, which is made using a laser direct structuring process, the antenna units 58-61 are here provided with a flexible substrate, for instance on a plastic backed metal foil. The antenna units are placed in a recess on the chassis and coupled to a lead that conducts the antenna signals to the receiver module 13.

All these antenna units are here placed into recesses on frame 11. If for instance for regional differences slightly different communication bands are needed, it is relatively easy to replace an antenna unit. An antenna unit may be provided with a connector that snap-fits or form-fits onto a connector end on the chassis. Thus, an antenna unit is mechanically connected to the frame and thus to the chassis. Here, the connector also functionally connects an antenna unit to the communication device.

Figure 15:
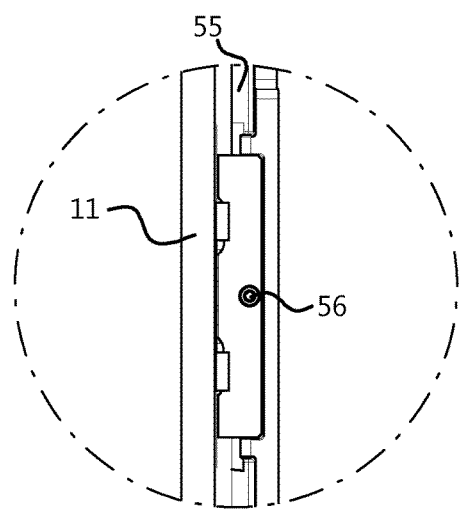
FIG. 15 schematically a detail of the chassis of the electronic device of FIG. 1 as indicated in FIG. 2.

FIG. 15 schematically shows a detail of the chassis of the electronic device 1 of FIG. 1 as indicated in FIG. 2, showing the grounding of a coaxial (shortly coax) line 55 for an antenna unit, here the LDS main antenna 57. The coax line has a shielding cladding or sheath that is grounded to the conductive back plate 27 of the display module, just like the other modules. To that end, to ensure a reliant grounding, the coax line 55 has a "pogo" pin 56 that has one end connected to the shielding of the coax line and a biased end to connect to the conductive back plate 27 when the display module 8 is installed on the chassis. The pin 56 in an embodiment comprises a cylindrical bus comprising a coaxial pin that is biased or spring-loaded.

The modules need to be functionally coupled to the (further) electronic device. To that end, a bus is provided, and connectors. These connectors have two connector ends that can be coupled. These connectors thus have a connector end coupled to the bus and another connector end integrated into a module. In the module, the connector end is coupled to the circuit board of the module. That connector end can be part of the circuit board. For instance, as will be illustrated below, the housing of a module may comprise an opening that allows access to that connector end. The rim of the opening in the housing may hold parts of the connector end, as will be illustrated.

A connector comprises a first connector end, which comprises a series of first contacts and a first shielding part, and a second connector end comprising a series of second contacts and a second shielding part. When said first and second connector ends are mutually connected, at least part of said first and second contacts are in electrical contact, and said first and second shielding parts are in electrical contact and provide an electromagnetic shielding surrounding said first and second contacts. The contacts are in electrical contact with leads of the earlier mentioned bus.

Several embodiments of the connector ends are discussed below. Here, one connector end is provided on the module and the other connector end is provided on the further electronic device. It may also be possible to alter this.

Figure 16:
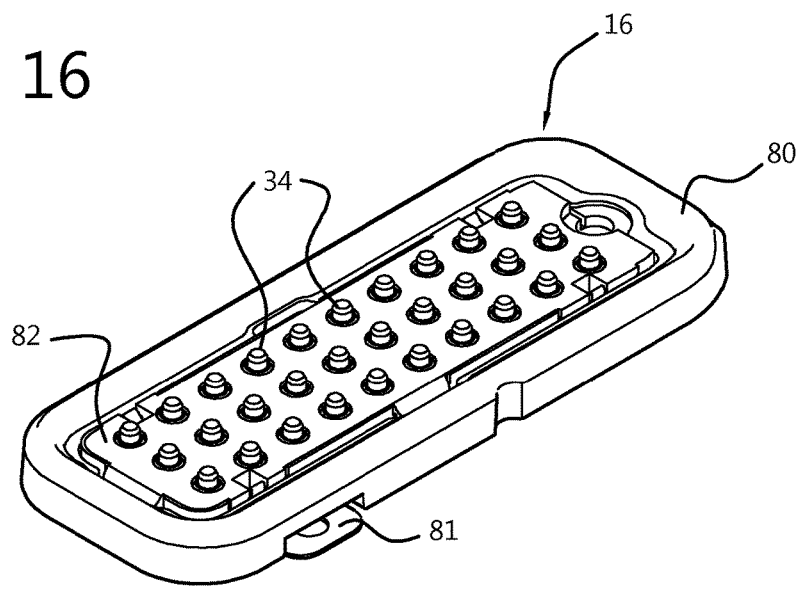
FIGS. 16-19 show respectively a perspective view from above, from below, an exploded view and a top view of an embodiment of a connector end.
Figure 17:
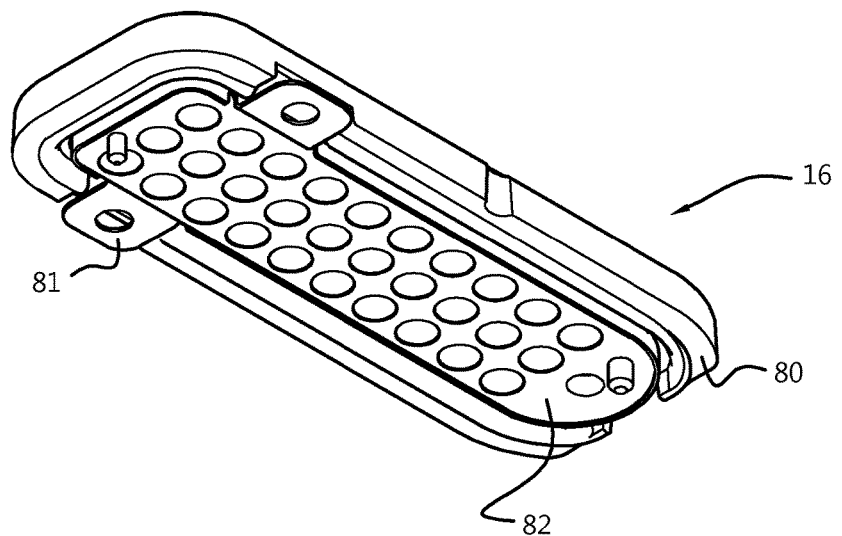
Figure 18:
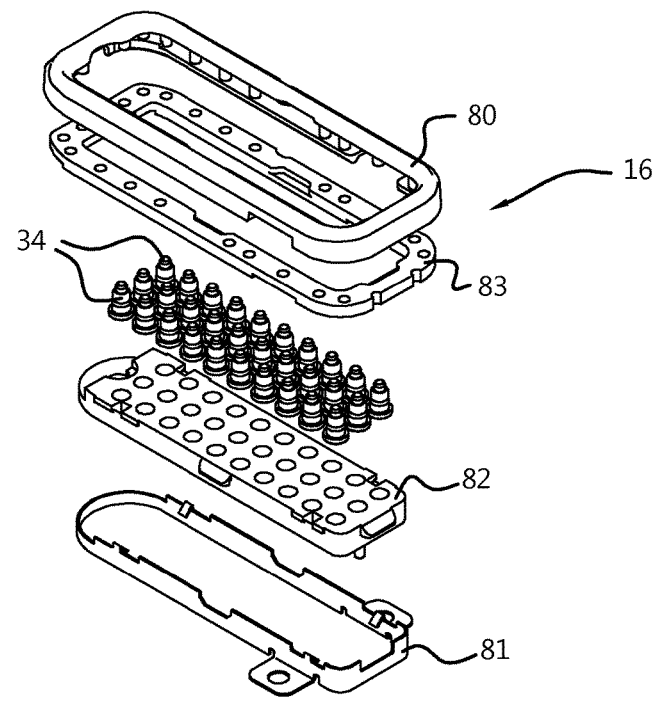
Figure 19:
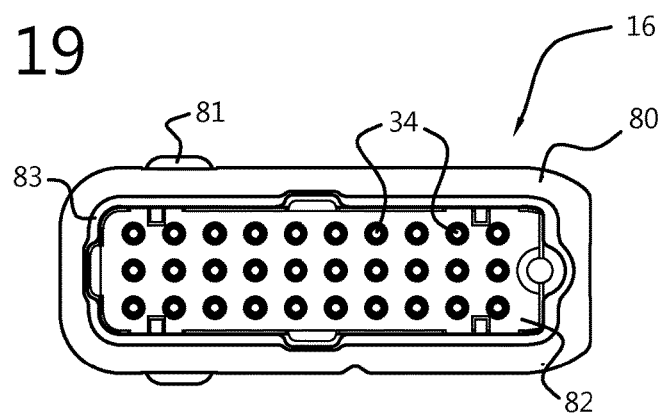

FIGS. 16-19 show respectively a perspective view from above, from below, an exploded view and a top view of an embodiment of a connector end. The connector end uses a series of biased contacts 34. The contacts can be pins. In the current embodiment, a series of so-called Pogo Pins is used. These are already described in more detail above. These pins are spring-biased away from the connector end. Thus, when the connector end is brought in contact with an opposite or complementary connector end, the contacts 34 will be compressed a little. In this way, a sure contact is secured. The contacts 34 are arranged in a matrix-setting. Each contact corresponds to a contact in the complementary connector end. The contacts in this embodiment connect each to a lead of a physical bus. In order to keep the contacts positioned, a connector body 82 is provided. Here, a polymer block is provided with through holes that define the positions of the contacts. The connector end shown in FIG. 16 can be used in the modular device described earlier. Here, it can be attached on the chassis, in particular on the circuit board, see for instance FIG. 13. When a module is coupled and connected to the chassis, the connector end of FIG. 16 established a functional coupling of the module. In particular, the connector end of FIG. 16 is especially suited for provided a sliding contact. It thus is suited for connecting for instance to the display module 8, which is slid into contact with the chassis 9 or frame 11.

The connector end is in particular used in electronic devices that use various type of wireless communication. Furthermore, a data processor is included, and the modular electronic device has modules that can be dismounted and mounted. It was found that for proper functioning of the connector as well as for the electronic device, careful shielding of the contacts is of importance. Therefore, a Faraday cage should be created around the contacts. Furthermore, the Faradays cage should be as tight as possible, preventing tiny leaks.

As already mentioned earlier, the connector end comprises a conductive ring. The connector end comprises a conductive ring around the contacts 34. In fact, the conductive ring comprises a peripheral surface that extends at least up to the end of the connector mounting block. An opposite end of the conductive ring or electromagnetic radiation gasket connects to the grounding of the further connector end In the current embodiment, a connector shielding ring 81 is mounted around the connector body 82. The connector shielding ring 81 is for instance a metal ring of conductive, ridged polymer ring. The connector shielding ring 81 contacts the grounding of the connector end. In the current embodiment, the connector shielding ring 81 comprises lips (here two) for contacting to the grounding of the connector end 16. Provided around the connector shielding ring 81 is the conductive gasket 80, for instance a conductive elastomer shielding gasket 80. This gasket 80 comprises an elastically compressible conductive first ring 80. In the current embodiment, for providing a better definition of the shape of the conductive ring, it comprises an additional reinforcement ring 83. The first conductive ring in an embodiment is made from a conductive elastomeric material. In particular, it can be made from a conductive, injection-mouldable conductive polymer material. This material may be injection moulded or 3D printed around the inlay reinforcement or support ring 83. The reinforcement ring 83 can be from a metal, or from a ridged, conductive polymer material.

When a module is installed, its is pressed with its connector end onto the current connector end 16. This will compress the conductive ring, pressing it into contact with the connector end of the module. Usually, a conductive ring patch is provided that surround the contacts of the module end of the connector. The conductive ring then contacts the conductive ring patch. Furthermore, the contacts are compressed against their biased pressure and into contact with contacts of the complementary connector end. The compression is to ensure a sure and electromagnetically leak-tight shielding contact.

Figure 20:
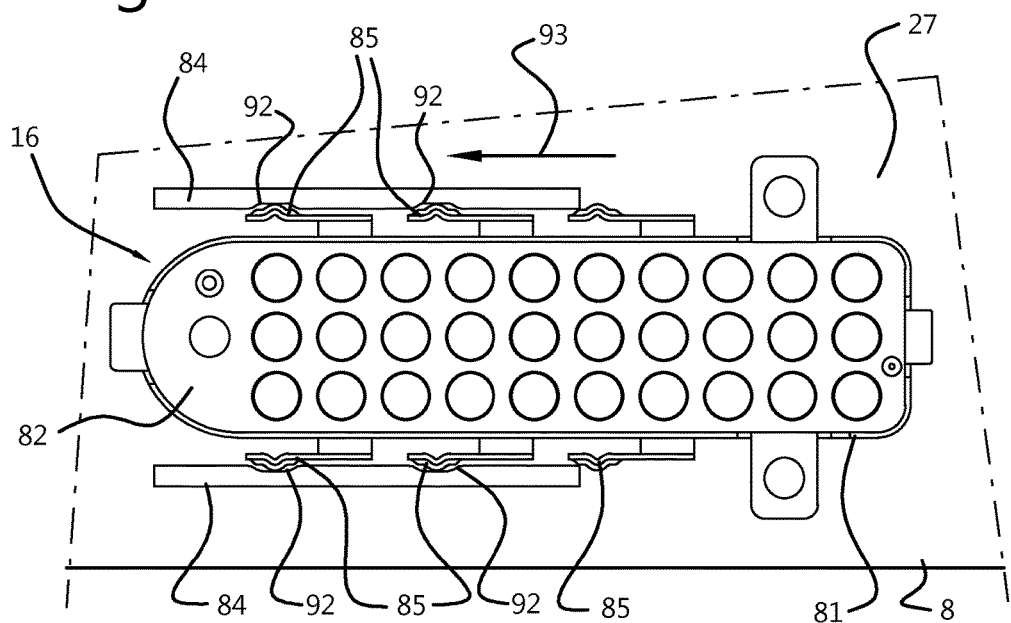
FIGS. 20-21 show an alternative embodiment of a connector.
Figure 21:
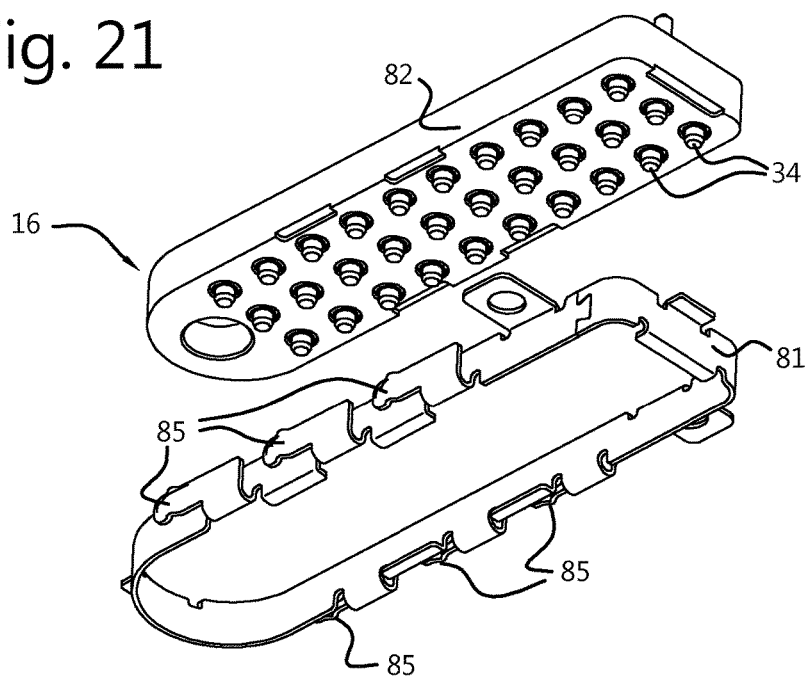

FIGS. 20-21 show an alternative embodiment of a connector. A sure shielding is of importance. In am embodiment, this design has a gap of 0.2 mm. The gap was designed such that only signals with a wavelength of 15 GhZ of higher would be able to pass through the gap and as such it would attenuate signals below this frequency. 15 Ghz was chosen as it is a tolerance that can be maintained in production and is also the 15th Harmonic of the display signals which is 1 volt signal, meaning that signals at a $15^{th}$ harmonic would be very highly attenuated and therefore not likely to influence the operation of any other part of the design. Thus the principal of the shield is to define a electrical contact with low resistivity and shielding capability designed to fit with the application and the frequencies being used in the device. The embodiment of FIGS. 20-21 is in particular suited when a sliding motion is included in the contacting of connector ends. For instance, the connector shown in this embodiment is in particular suited for use in the electronic device describe above, more in particular for functionally coupling a display module 8 to the chassis 9.

In FIG. 20, a top view is provided, showing the connector end that is connected to the chassis from its rear side. The contacts 34 extend to the opposite direction, into the paper. Here, the further chassis 9 is deleted. In fact, the top view of FIG. 20 looks unto the rear side of the display module 8 (comparable to FIG. 4).

In this embodiment, again a conductive ring 81 is provided around the connector body 82. The conductive ring 81 comprises flexible contacts 85. These flexible contacts 85 can flex toward the conductive ring 81. In the current embodiment, as can best be seen in FIG. 21, the conductive ring 81 has co-shaped lips that originally extended in axial direction of the ring and toward the rear of the connector end. At the ends of these lips, contact lips 85 extend parallel to the conductive ring 81. Here, the ends of the lips are bent over towards the conductive ring 81, in such away that the contact lips 85 extend substantially along the conductive ring 81.

In this embodiment, next to the other connector end, here of a module, here the display module 8, two opposite conductive walls 84 are provided. The spacing between these walls is just a little less that the width of the connector end including the contact lips 85, but just a little more that the width of the connector end. Thus, when the connector ends are connected, the contact lips 85 are a little compressed and press against the conductive walls 84. Here, the conductive walls 84 are provided with recesses 92 that correspond to positions of the contact lips 85. When the connector end 16 slides between the conductive walls 84 in direction 93 into a connected position, the contact lips 85 snap into position in the recesses. Also in these recesses 92, the contact lips 85 remain a little compressed towards the connector end 16.

In case the module is the display module 8, like in this embodiment, the conductive walls are part of the conductive back plate part 27 of the display module 8, and direction 93 is the display slide direction S.

FIG. 21 shows the connector of FIG. 20 in a partly exploded view, with the conductive ring removed from the connector body 82. It thus shows the opposite side of the connector end.

Figure 22:
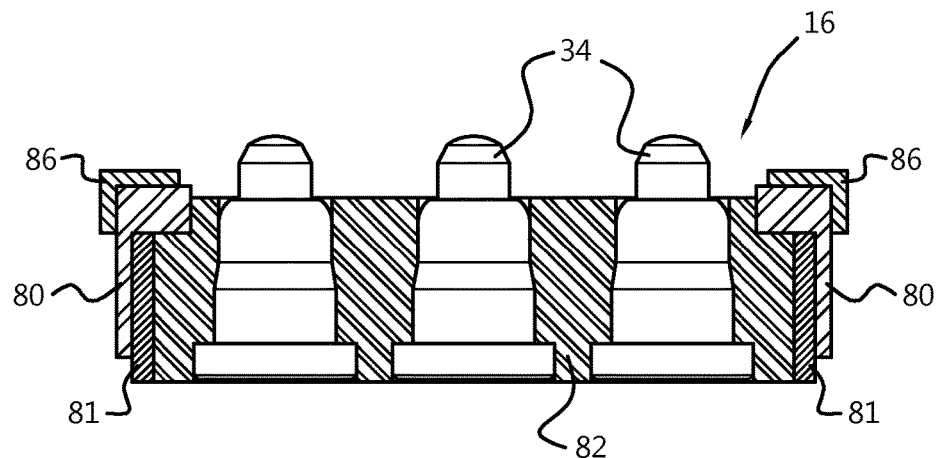
FIG. 22 shows an alternative embodiment of a connector end.

FIG. 22 shows an alternative embodiment of a connector end. Here, the shielding part comprises an elastomeric gasket 80 that surrounds the connector body 82 holding the contacts 34. Here, a conductive ring 81 surrounds the connector body 82 fittingly, and the elastomeric gasket 80 in turn surround the conductive ring 81. The elastomeric gasket 80 is made from a conductive elastomer. It was found that in particular when the connector end is used in a connector where the connector ends slide in position, like for instance for the display module 8, than the contact surface of the elastomeric gasket 80 may be subject to tearing. To that end, a slide-protective surface 86 is provided on top of the elastomeric gasket 80. The slide-protective surface may comprise a further conductive ring or washer 86. The slide-protective surface may be a metal ring or a ring from a conductive polymer. These parts may be clipper-on, press-fitted, moulded onto the connector end, or even 3D printed onto the connector end 16. The surface of the further conductive ring extends above the connector body. It may extend up to the ends of the contacts 34, here it extends a little below the contacts. This embodiment may be combined with the earlier embodiment of FIGS. 16-19.

Figure 23:
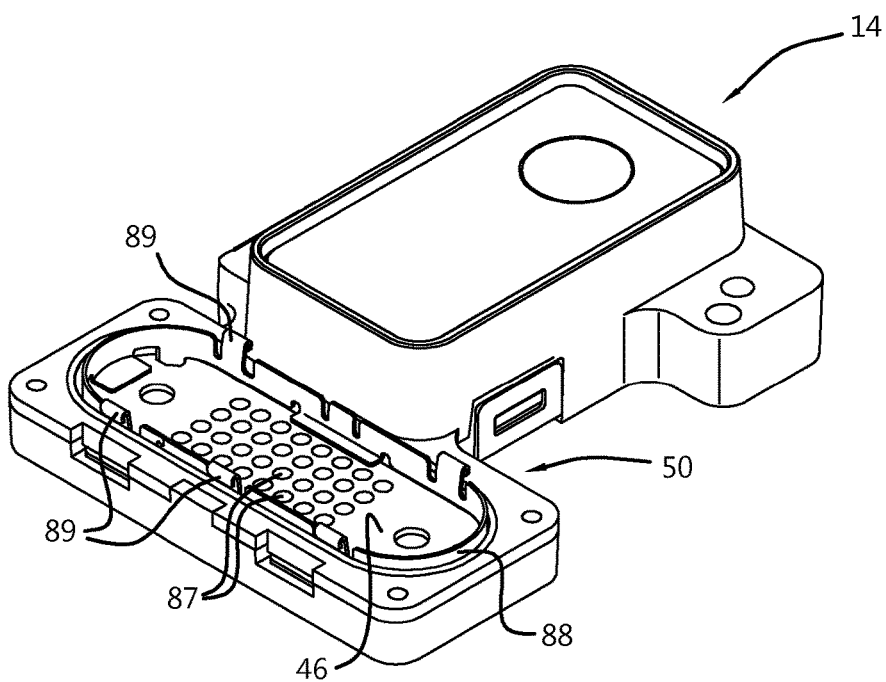
FIGS. 23-25 show an embodiment of a connector end, here the module connector end, in perspective view, in cross section and showing the conductive ring.
Figure 24:
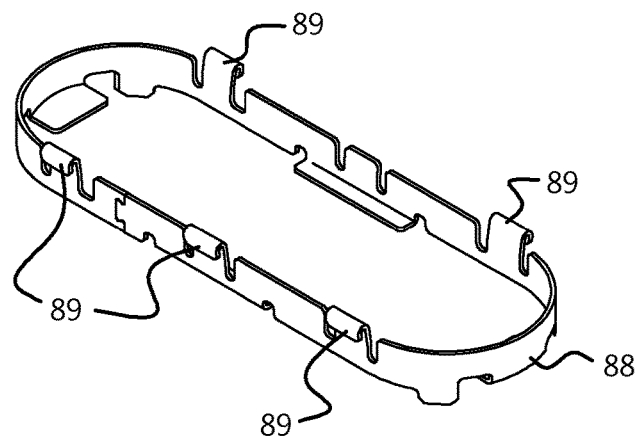
Figure 25:
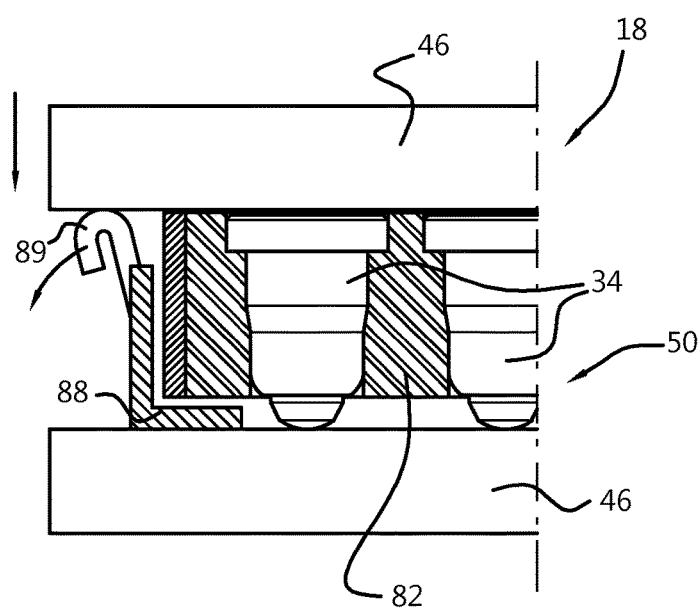

FIGS. 23-25 show an embodiment of a connector end, here the module connector end 50 of a camera module 14, in perspective view, in cross section and showing a conductive ring 88 forming part of the shielding part separately. The conductive ring 88 forms a conductive wall around the contacts 87. This conductive wall extends at least up to the housing of the module.

Both connector ends of a connector may be provided with a conductive ring forming respective shielding parts. In a relatively simple embodiment, the connector end 50 of a module comprises only contact patches 87, usually at least some contact patches 87 corresponding to contacts of the complementary, other connector end. This is in fact illustrated in the camera module in FIG. 23. In the embodiment of FIGS. 23-25, the conductive ring 88 extends above the contacts 87. The conductive ring 88 is here soldered on a grounding track (not visible) of the lower circuit board or PCB 46. This conductive ring 88 comprises contact lips 89 that extend in an axially direction. The contact lips 89 furthermore here extend above the rim of the conductive ring 88. The lips extend in FIG. 23 out of the housing of the camera module 14. FIG. 24 which shows only the conductive ring 88 illustrates this. It can be see that here the ends of the contact lips 89 are bent outwards, in a radial direction, away from the connector end 50. The conductive ring 88 of made from a resilient, flexible material like a flexible metal or polymer material. Next to the contact lips 89, small cut-outs in axial direction are made in the conductive ring 88. This further allows the contact lips 89 to flex outward with respect to the connector end 50. When a module is installed onto the chassis 11 and both connector ends are in contact one pushed onto the other in the direction of the arrow, the contact lips 89 are pushed outward (in a radial direction), in an embodiment providing contact with the conductive ring on the printed circuit board of the chassis 11, thus forming a Faradays cage all around the connector.

In general, a module will have the most simple end of the connector. In the most elementary form, that connector end has patches 87 on the circuit board 46 as contacts, and a grounding track around the patches as shielding part. The conducting ring 88 can be added to the shielding part as shown in FIG. 23.

This connector end may be connected to the connector end of FIGS. 16-19. In such an embodiment, the gasket 80 fits against the ring 81, in an embodiment providing a tight fit.

Figure 26:
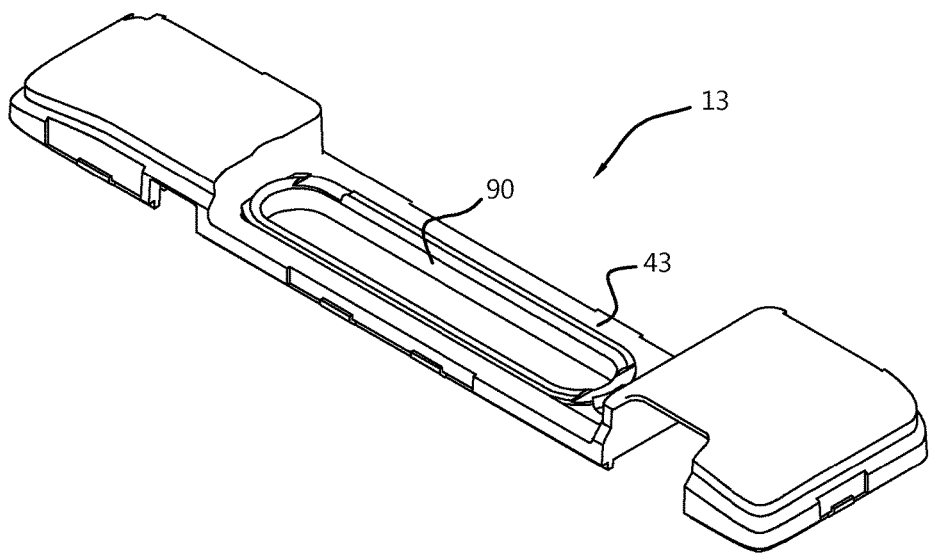
FIGS. 26-27 and alternative embodiment for the module connector end shielding.
Figure 27:
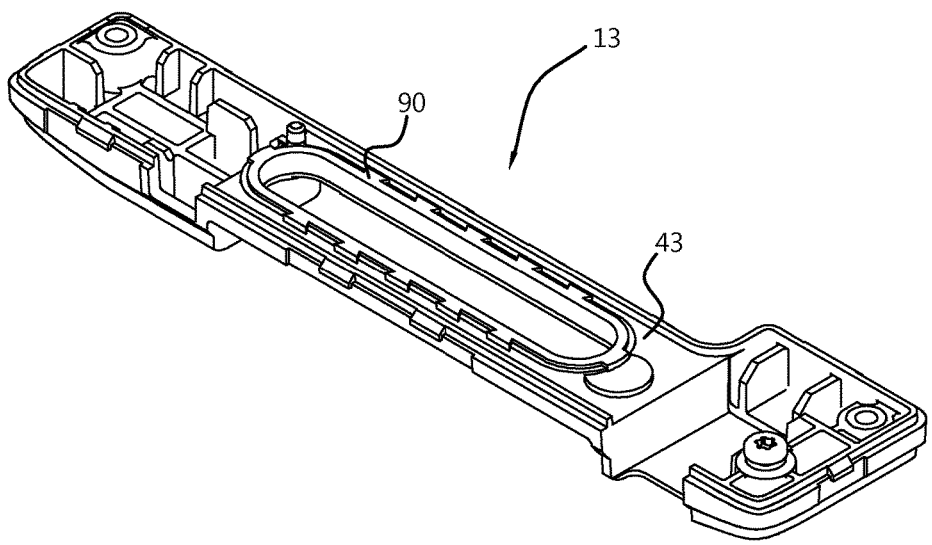

FIGS. 26-27 and alternative embodiment for the module connector end shielding. Here, as an example a housing part of the received module 13 (see FIG. 11) is used as an illustration of this embodiment. To form the conductive ring, in this embodiment a conductive gasket 90 is provided on the housing part 43. The housing part 43 has an opening that provides access to the connector end 51 (see e.g. FIG. 11) of that module. The conductive gasket 90 extends toward the outside of the housing part 43 to contact a conductive ring of a (complementary) connector end 19 (see FIG. 3, e.g.) of the chassis 11. The conductive gasket 90 extends to the inside of the housing part 43 to such an extent that it contacts a further conductive ring or conductive track of the connector end of the module, here the receiver module 13. In this embodiment, to make a module as simple as possible, a connector end of a module may comprise a circuit board part having the already explained conductive patches and a conductive layer or track surrounding the patches in a closed ring, this providing part of the shielding part. This is also discussed with respect to FIG. 23. The circuit board is provided in the housing part in such a way that the opening provides access to these patches, while the conductive gasket 90 with its contact surface at the interior side of the housing part pressed into contact with the conductive ring or track on the circuit board 46 (FIG. 11).

The connector end of the chassis 11, for instance one of the connector ends 16-19 (FIG. 13), may be featured like FIG. 16 or FIG. 22. Thus, the contact surfaces of conductive gasket 80 or 86 of these figures is pressed in contact with the contact surface of the conductive gasket 90 of the housing part 43 of a module. Alternatively, a simple connector end comprising only the pins 34, connector body 82 and the ring 81 may be provided on the chassis. The connector are dimensioned in such a way that the conductive gasket 90 fits tightly around the ring 81 when the connector ends are connected to one another.

The conductive gasket 90 can be of an elastomeric material, for instance a conductive elastomer. An example of such a material is conductive silicon, for instance Parker Chomerics CHO1270 or functionally similar material.

The conductive gasket 90 can be formed separately from the housing part 43, and applied to it in a separate production step. Alternatively, it may be moulded onto a housing part 43 in more-component injection moulding process. In may also be moulded onto a housing part 43 in a separate moulding process. The housing part 43, the conductive gasket and/or the combined housing part/conductive gasket 90 may also be produced in a 3D printing process.

In summary, the current invention relates to at least one of the following.

A modular smart device design intended to allow consumers to repair and/or to replace and/or to upgrade various modules and/or components within a smart device without specialist knowledge or tools. Smart devices are fragile and are prone to breakages, the present invention allows a user of the device to remove a series of modules that contain the most commonly broken elements of a smart device and replace these easily without specialist equipment. The clustering of the respective components that are prone to damage has been carefully considered to ensure that over 80% of the most likely to be damaged parts are changeable by module/user replacement.

To enable the user of a device to either upgrade of repair a smart device easily and quickly and for a low cost.

The implementation of the overall design and the grouping of the components in various modules brings a number of benefits. Firstly it allows the creation of interfaces for each module which can be standardised for each type of module. This is reflected in both the mechanical and electronic design of the interfaces. The interfaces have been designed to reduce pin count and to allow where possible the abstraction of the module from the computational and communication (CC) module to allow of upgradability in the future. Modules have been designed to minimise complexity and pin requirements and are grouped in clusters by the likely hood of breaking. For example, we have separated items that have high breaking opportunities to avoid that if one module does break this often results in replacement of a high cost module. For example, we do not include the cameras into the display module as both have a high incidence of breaking and are both high cost items. The selection of the components incorporated into each module is novel as it groups device functions both by proxy to where they are most likely to be used but also to the damaged they may sustain. An example of that if the device is dropped and it hits the ground on the bottom edge it may damage the power connectors on the bottom of the phone. We have grouped mechanical devices that are also subject to mechanical drop damage, such as the vibrator, into the same module. In this way only one module needs to be changed if more than one components is damaged by a drop. We also looked at the cost structure of modules. For example as mentioned earlier, we have not located the cameras and display module together in one module as these are all high breakage items and therefore this module would be changed more frequently and also the cost of these components is high. So if a display module included cameras, and all that was broken was the display, the user would be paying for cost of the cameras to be replaced even if they this instance they where not damaged.

As mentioned, displays are frequently broken and touch panel are damaged. It was first found that about 33% of the devices suffer from an accident of failure during their lifetime. Over 50% of all smart devices repairs are for broken displays. User often have to return the device to the manufacturer to have displays replaced, leaving them without the use of the device.

The novelty in this aspect stems from the display module latching/clipping and mechanical features of the design which allow for a robust product while still allowing the display to be removed. The section of magnesium for the main display frame provides rigidity. The frame is designed to use plastic that is double shot injected or overmoulded into the section of magnesium, provided as an inlay. The plastic part provides for the clip features to be formed. This allows the clips to bend and flex during assembly and disassembly and to be more durable. The use of a standardised interface which is designed to reduce crosstalk and has a novel grounding solution (see later) and abstracts the specific's of the display electronics from the device electronics allows the display to be upgraded in future. The display module here does not include the automatic light sensor (ALS) nor the camera. There a novel detail that allow the ALS and the front facing camera to reside in the receiver module so that the cost of the display module can be kept as low as possible, and the ALS and camera do not need to be needlessly replaced when the display is changed.

The display module includes the display and touch panel and can be replaced without any tools by the user simply removing the rear case, removing the battery, sliding a catch and then sliding the display module off the smart device. To install a new or replacement display is the reversal of removal. Displays can also be upgraded as the display electronic interface is abstracted from the CC module. The use of a standard interface which abstracts the phones electronics from the display allows for new upgraded displays to be fitted to the smart device later. The location of the clips around the display connector are very specially designed to ensure that good contact is maintained between the pogo pins and the display printed circuit board (PCB) such as when throwing the smart device on to a table top which could cause a minor disconnection on one pogo pin which may result in a malfunction of the device.

Camera and flash breakages account for approx. 10% of all Smart device repairs. Users often have to return their device to the manufacturer for the camera or flash to be repaired, leaving them without the use of their device.

The novelty stems in this aspect from the camera module latching and mechanical features of the design which allow for a robust product while still allowing the camera to be removed. It relates to the use of a standardised interface which is designed to reduce crosstalk and has a novel grounding solution (see later) and abstracts the specific's of the camera electronics from the device electronics, which allows the camera to be upgraded in future.

The camera module includes both the camera module and the camera flash/phone flashlight and can be replaced by removing 2 standard Phillips screws (tools available to most users). The vertical insertion and the specific design of the camera module prevent incorrect assembly by the user.

Front camera breakages/defects account for approx. 4% of breakages in smart devices. Audio jack breakages account for approx. 4% of all breakages in smart devices, and receiver and sensor breakages/defects account for approx. 2-3% of all smart device repairs. Again, users often have to return their device to the manufacturer for these components to be repaired leaving them without the use of their device.

The novelty in an aspect further stems from the receiver module latching and mechanical features of the design, which allow for a robust product while still allowing the receiver module to be removed. The use of a standardised interface which is designed to reduce crosstalk and has a novel grounding solution (see later) allows the receiver module to be changed easily. Sealing of the camera and ALS devices allowing them to seal against the sliding display module but be mounted in the display module which is novel and reduces the complexity of the display module and the cost.

The receiver module includes in an embodiment the front facing camera, the receiver, the automatic light sensor (ALS), the status LED and the earpiece audio jack. It can be replaced by removing 2 standard Phillips screws (tools available to most users). Vertical insertion and the specific design of the receiver module prevent incorrect assembly by the user.

Power connector (USB) breakages/defects account for approx. 3% of breakages in smart devices. Speaker breakages account for approx. 4% of all breakages in smart devices, and vibrator breakages/defects account for approx. 2-3% of all smart device. Again, repairs for which users often have to return their device to the manufacturer for these components to be repaired, leaving them without the use of their device.

The novelty stems in this aspect from the speaker module latching and mechanical features of the design which allow for a robust product while still allowing the speaker module to be removed. It includes the use of an standardised interface which is designed to reduce crosstalk and has a novel grounding solution (see later), and which allows the speaker module to be changed easily. Sealing of the USB connector provides a method to stop the ingress of fluids/dust, which is a common failure mechanism in smart devices.

The speaker module here includes the micro USB power connector, the speaker, and the vibration motor. It can be replaced by removing 2 standard Phillips screws (tools available to most users). Vertical insertion and the specific design of the speaker module prevent incorrect assembly by the user.

The abstraction of the computational and communications (CC) module from the peripherals of the smart device allows for both the CC module to be altered for another type of CC module for repair purposes or for upgrade. The biggest benefit of the creation of the CC module is that CC modules have a longer lifetime than the peripheral of a smart device and are improved on a slower cadence—for example a transition from 4G to 5G networks will take a number of years to replace one another. It is these types of changes that drive changes in the CC module, where as display and camera technology will undergo several generation changes and improvements during this time.

An aspect of the novelty of the CC module is that it provides a set of standard interfaces either/or mechanical/electrical that allow the replacement and upgrade of peripherals connected to or that are part of the smart device. The CC module in an embodiment has a unique design of pogo connectors which have a novel grounding solution allowing the robust grounding of signals for high speed communications buses such as the Mobile Industry Peripherals Interface (MIPI) whilst allowing easy assembly and disassembly.

The computational and communications module in an embodiment includes the application processor, memory, storage, RF Circuitry, gyro scopes, magnetometer and E-Compass. Together with the module connectors and associated shielding, all these components are here mounted on a single uniform PCB. CC evolution changes at a slower speed compared to the peripheral modules. Thereby abstracting the modules allows for the CC to remain constant and mature whilst the user desired peripheral enhancements can be repaired or added or upgraded to the smart device without having to upgrade the CC module. The CC module in an embodiment has only semiconductor components mounted onto it, meaning that is more robust than the other modules and hence less likely to break. It is the intention that the elements that can or do get damaged in a smart device are located or grouped intelligently into one or other of the smart device modules.

The design of the antenna in an embodiment allows the frequency range of the antenna to be changed without having to redesign the CC module or the mechanics of the smart device.

An aspect of the novelty of the design is that it isolates the main antenna that maybe subject to change for different geographies. In an aspect, a constraint of the design is such that it can be altered for frequency without a major redesign of the device. In one embodiment this alteration could be a late stage, and be configurable or customisation or can be a user changeable item.

Mounting of the communications antennas in this way provides flexibility to the design and a longer lifetime to the CC module.

The novelty of an aspect of this design is that it moves the antennas of the CC module and connects them via flying leads that allow for design flexibility, and places them in the chassis.

The main antenna can be formed using laser direct structuring (LDS) and in an embodiment has been designed in such a way as that it can be changed and modified for adaption of the phone to different markets around the world who may operate some of their WWAN commutations networks at different frequencies without having to redesign the entire smart device. The antenna is mounted on a piece of high permeability material that provides mechanical support and good dielectric isolation.

The communications antennas in an embodiment have been designed to be located into the chassis of the smart device on flying leads that are connected to the CC module via spring connectors. This allows for easy repair with no soldering and allows for the creation of new antennas for different frequencies. It abstracts the antenna placement from the design of the CC module and the casing of the smart device.

Another aspect relates to the prevention of the module connectors, formed via Pogo pins, from radiating unwanted or harmful RF energy into and/or externally from the device.

The novelty of an aspect is that in an embodiment the connectors use a low resistivity outer shield that is connected through a low resistivity flexible gasket to contact to a grounding plane on the module PCB. In an embodiment, the connector shield is connected to the screw bosses on the connector which then provide grounding to the shield which are insert molded into the top of the modules. These shields have grounding tags on them which provide further grounding to that back of the display module which provides large ground plane which the RF and unwanted electromagnetic energy can dissipate into.

The use of Pogo pins to connect high speed signals such as MIPI can pose problems in that the Pogo pins acts as an antenna and will radiate RF energy which may interfere with other electronics in the smart device. In an embodiment, a grounding solution is provided, comprising electronic grounding and RF shielding for these signals whilst at the same time allowing the module to easily replaced without the use of specialist tools To provide a mechanical moveable though good RF ground for the antenna coax, in an embodiment the ground plane of the device is located on the rear of the display module. To provide a good RF ground for the main Antenna PCB, the ground plane again is located on the rear of the display module Another problem is to prevent RF energy being radiated from the Coax into/out of the smart device or back onto the RF PA output.

In an embodiment, novelty of this aspect is that it provides a solid ground path for the antenna coax to the display module ground and which is able to move as the display module is removed.

A further or additional aspect is to allow upgrade of the smart device peripherals and modules without changing the CC module design.

A careful selection of interface signals and powers supply signals reduces the number of pins, and provides for the modules to be isolated from the CC module. This allows for future upgrades. An example of this is the rear facing camera and the display interface PCB.

Another aspect is to provide enhanced sealing of the smart device against dust and fluids ingress.

An aspect of the novelty an embodiment of this part of the device is that the rear case is designed to cover the sides of the phone and in doing so provides ingress protection (IP) sealing to the device.

In an embodiment, the use of sealing techniques in the outer cover and for the smart device external connectors provides enhanced IP protection to the device at minimal cost.

In order to prevent damage to display or CC module or other module when removing the display while the device is powered on or while the battery is attached.

The novelty in this aspect comprises that the display module and the battery module are mechanically linked to prevent the display module from being moved while the battery is in its operating position.

A further aspect relates to enabling case design differentiation using a common chassis design.

The chassis in an embodiment has been designed to accept either a snap over rear case and/or cover or a sliding rear case cover. This gives the user the choice of different mechanical case designs with the same smart device product and to provide for differentiation between different smart device models using the same core components. The locating elements for the rear case in an embodiment also act as strengthening features for the chassis. The chassis in the embodiment comprises an I-Beam section along the side of the chassis of the device, adding greatly to the strength of the product.

The creation of different modules allows for shorter more flexible manufacturing lines and optimised module assembly lines which reduces cost and improves quality It will also be clear that the above description and drawings are included to illustrate some embodiments of the invention, and not to limit the scope of protection. Starting from this disclosure, many more embodiments will be evident to a skilled person. These embodiments are within the scope of protection and the essence of this invention and are obvious combinations of prior art techniques and the disclosure of this patent.

REFERENCE NUMBERS 1 electronic device
2 display side
3 display
4 rear side
5 back cover
6 physical connector of power and/or data
7 camera opening in back cover
8 display module
9 chassis
10 battery
11 frame
12 computational and communication module on printed circuit board
13 receiver module
14 camera module
15 speaker module
16 display module connector
17 speaker module connector
18 camera module connector
19 receiver module connector
20 back cover sealing rim
21 back cover battery pressure gasket
22 camera sealing rim
23 speaker opening in back cover
24 receiver module opening in chassis
25 camera module opening in chassis
26 battery opening in chassis
27 conductive back plate part
28 battery blocking ledge/cam
29 display module locking latch
30 display attachment part
31 frame attachment part
32 frame lock cams
33 rails on frame for slide cover
34 contact pins
35 connector shielding rim
36 display module back plate
37 display module back plate circumferential rim
38 protective glass plate (of the display)
39 slide abutment
40 cam
41 notch
42 module front housing part
43 module rear housing part
44 module ground/shield plate
45 module ground contact lip
46 module circuit board
47 speaker module sealing
48 speaker module opening in chassis
49 speaker module connector end
50 camera module connector end
51 receiver module connector end
52 flash device including flash light pipe
53 camera device
54 module assembly clip
55 coax antenna line
56 coax antenna line grounding
57 main cellular antenna
58 Wi-Fi/Bluetooth (BT) antenna
59 MIMO high antenna
60 GPS antenna
61 MIMO low antenna
62 locking latch rail
63 cam
64 housing opening
65 speaker
66 front camera device
67 vibrator
68 microphone booth
69 graphite heat spreader layer
80 elastomer shielding gasket
81 connector shielding ring
82 connector body
83 conductive support ring
84 conducting wall parts
85 connector shielding contact lips
86 conductive cover ring
87 module connector end contact patches 88 module connector end shielding ring
89 flexible contact lips
90 conductive elastomeric shielding ring
91 conducting wall recesses
100 expansion port
S display slide direction
L lock line
N normal to display

The invention claimed is:

1. A connector for functionally coupling a module into a modular electronic device, said connector comprising:
   a first connector end which comprises a series of first contacts and a first shielding part;
   a second connector end comprising a series of second contacts and a second shielding part, wherein when said first and second connector ends are mutually connected, at least part of said first and second contacts are in electrical contact, and said first and second shielding parts are in electrical contact and provide an electromagnetic shielding surrounding said first and second contacts, wherein at least one of said first and second shielding parts comprise a conductive ring which comprises a shielding gasket around said contacts, which shielding gasket is an elastically compressible and electrically conductive shielding gasket,
   wherein said shielding gasket is attached into an opening in a housing holding one of said first or second connector ends providing coupling access to said connector end via said opening,
   and wherein said second contacts are conducting patches, positioned for a patch to correspond to a first contact, and said patches surrounded by a peripheral conductive track surrounding said contact patches for providing at least part of said second shielding part.

2. The connector of claim 1, wherein said shielding gasket comprising an elastomeric ring moulded onto said housing.

3. The connector of claim 1, wherein said first contacts comprise biased contact pins comprising a spring-biased end movable in an axial direction of said contact pins, said first contacts comprise spring-biased ends axially movable in a cylinder,
   wherein said first connector end comprise a connector body housing said contact pins and at least one of said shielding parts further comprise a conductive ring around said connector body, and
   wherein said second contacts are conducting patches, positioned for a patch to correspond to a first contact, and said patches surrounded by a peripheral conductive track surrounding said contact patches for providing at least part of said second shielding part.

4. A plug for a connector of claim 1, forming a first connector end of said connector.

5. A socket for a connector claim 1, forming a second connector end of said connector.

6. A connector for functionally coupling a module into a modular electronic device, said connector comprising:
   a first connector end which comprises a series of first contacts and a first shielding part; and
   second connector end comprising a series of second contacts and a second shielding part;
   wherein when said first and second connector ends are mutually connected, at least part of said first and second contacts are in electrical contact, and said first and second shielding parts are in electrical contact and provide an electromagnetic shielding surrounding said first and second contacts, wherein at least one of said first and second shielding parts comprise a conductive ring which comprises a shielding gasket around said contacts, which shielding gasket is an elastically compressible and electrically conductive shielding gasket, and wherein at least one of said shielding parts comprise a conductive ring, in particular enclosing a connector body, said conductive ring comprising connector lips that extend substantially parallel to said shielding ring and that are flexible in radial direction toward said shielding ring, and the other shielding part comprises conductive walls extending at opposite sides of the contacts, and having a mutual distance adapted for engaging the connector lips biased towards the connector end.

7. The connector of claim 6, wherein at least one of said first and second shielding parts comprise a conductive ring, wherein said conductive ring comprises a shielding gasket around said contacts, said shielding gasket is an elastically compressible and electrically conductive shielding gasket, wherein said shielding gasket comprises a conductive elastomer ring, said shielding gasket comprises a ridged metal insert, in said elastomer ring.

8. The connector of claim 6, further comprising a conductive, slide-protective surface on said shielding gasket.

9. The connector of claim 6, wherein at least one of said shielding parts comprises a conductive ring comprising contact lips extending in an axial direction of said conductive ring at least up to the ends of the contacts, said contact lips being flexible to allow flexing away from said connector body, for contacting the other shielding part, for instance a grounding track on an opposite circuit board.

10. The connector of claim 6, wherein said second contacts are conducting patches, positioned for a patch to correspond to a first contact, and said patches surrounded by a peripheral conductive track surrounding said contact patches for providing at least part of said second shielding part.

11. A modular electronic device, said modular electronic device comprising a connector for functionally coupling a module into said modular electronic device, said connector comprising a first connector end which comprises a series of first contacts and a first shielding part, said connector further comprising a second connector end comprising a series of second contacts and a second shielding part, wherein when said first and second connector ends are mutually connected, at least part of said first and second contacts are in electrical contact, and said first and second shielding parts are in electrical contact and provide an electromagnetic shielding surrounding said first and second contacts, wherein at least one of said first and second shielding parts comprise a conductive ring which comprises conductive ring comprises a shielding gasket around said contacts, which shielding gasket is an elastically compressible and electrically conductive shielding gasket, said modular device comprising a chassis comprising a bus comprising at least two first connector ends, and at least two modules each comprising a second connector end, and further comprising:
   a chassis comprising a frame holding a computational module comprising a circuit board holding a data processor and said bus, and
   a display module comprising a planar display device having a viewing side and a rear side, said display module comprising a back plate on the rear side of the display device,
   wherein said chassis comprises at least one of said first or second connector ends and said modules comprises said other of said first and second connector end.

12. The modular electronic device of claim 11, wherein said back plate of said display module comprises an electrically conductive plate forming an electromagnetic shielding layer for providing a common ground for said modular electronic device, said conductive back plate is from one selected from magnesium and a magnesium alloy, for providing rigidity to said display module, and said conductive back plate is electrically coupled to at least one of said shielding parts.

* * * * *